United States Patent [19]
Yamazaki et al.

[11] Patent Number: 6,165,876
[45] Date of Patent: Dec. 26, 2000

[54] METHOD OF DOPING CRYSTALLINE SILICON FILM

[76] Inventors: Shunpei Yamazaki, 4-10-20, Seijo, Setagaya-ku, Tokyo 157; Naoto Kusumoto, 202, 2-26-2, Higashi-Ohtake, Isehara-shi, Kanagawa-ken, 259-11; Hideto Ohnuma, Flat SEL-A 306, 304-1, Hase, Atsugi-shi, Kanagawa-ken 243; Yasuhiko Takemura, San White Harashima 202, 934-3, Aiko, Atsugi-shi, Kanagawa-ken 243; Koichiro Tanaka, Flat SEL-B 102, 304-1, Hase, Atsugi-shi, Kanagawa-ken 243, all of Japan

[21] Appl. No.: 08/590,417

[22] Filed: Jan. 24, 1996

[30] Foreign Application Priority Data

Jan. 30, 1995  [JP]  Japan .................................. 7-032969
Jan. 30, 1995  [JP]  Japan .................................. 7-032970

[51] Int. Cl.[7] ........................ H01L 21/265; H01L 21/266
[52] U.S. Cl. .......................... 438/517; 438/530; 438/532; 438/289; 438/291; 438/217; 438/166; 438/163
[58] Field of Search ..................... 438/163, 166, 438/217, 289, 291, 530, 532, 535, 540, 514, 517, FOR 184, FOR 201, FOR 155

[56] References Cited

U.S. PATENT DOCUMENTS

| | | | |
|---|---|---|---|
| 4,168,990 | 9/1979 | Lenie et al. ............................ | 438/530 |
| 4,169,740 | 10/1979 | Kalbitzer et al. ...................... | 438/530 |
| 4,199,773 | 4/1980 | Goodman et al. ..................... | 438/163 |
| 4,463,492 | 8/1984 | Maeguchi ............................... | 438/166 |
| 4,775,641 | 10/1988 | Duffy et al. ............................ | 438/166 |
| 5,064,775 | 11/1991 | Chang .................................... | 438/166 |
| 5,244,820 | 9/1993 | Kamata et al. ........................ | 438/530 |
| 5,403,762 | 4/1995 | Takemura .............................. | 438/166 |
| 5,501,989 | 3/1996 | Takayama et al. .................... | 438/166 |
| 5,532,175 | 7/1996 | Racanelli et al. ..................... | 438/163 |
| 5,565,690 | 10/1996 | Theodore et al. ..................... | 438/530 |

OTHER PUBLICATIONS

"Implantation temperature effect on polycrystalline silicon by ion shower doping," Y. Mishima, et al., Journal of Applied Physics; vol. 74; Dec. 15, 1993; No. 12.

*Primary Examiner*—Mary Wilczewski
*Attorney, Agent, or Firm*—Fish & Richardson P.C.

[57] ABSTRACT

After an ion having n-type or p-type impurity necessary for a crystalline silicon film is implanted by a known ion implantation or ion doping, a laser light or an equivalent intense light is irradiated onto the crystalline silicon film, to thereby improve the crystallinity of the silicon film and activate the impurity, and in the succeeding process, the silicon film is not thermally annealed at 450° C. or higher. Also, under a state where a substrate is heated at 50 to 500° C., preferably 200 to 350° C., an ion having n-type or p-type impurity necessary for a crystalline silicon film is implanted by the ion doping, and in the succeeding process, the silicon film is not thermally annealed at 450° C. or higher.

25 Claims, 12 Drawing Sheets

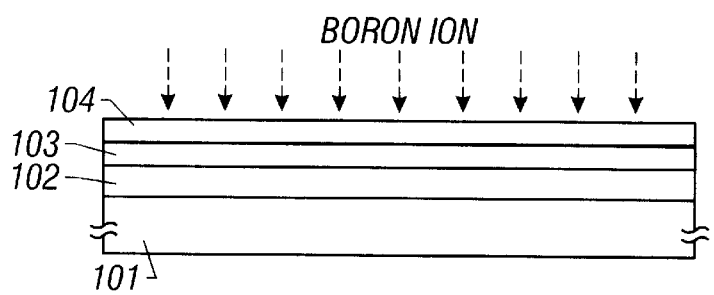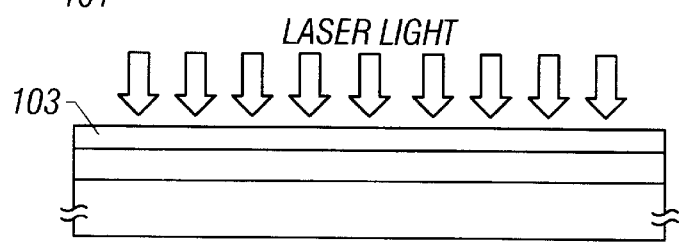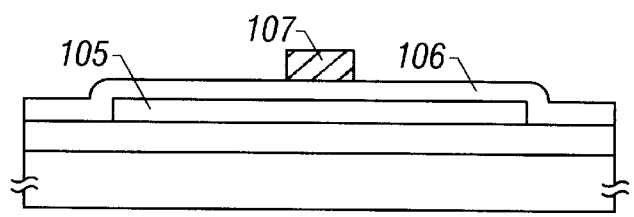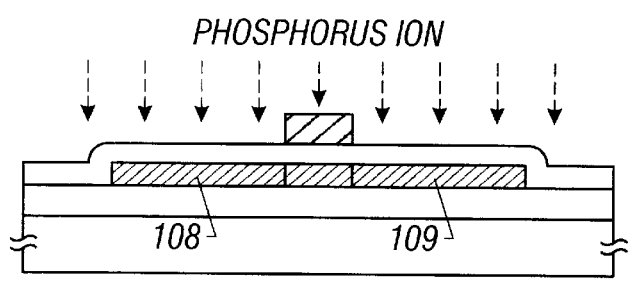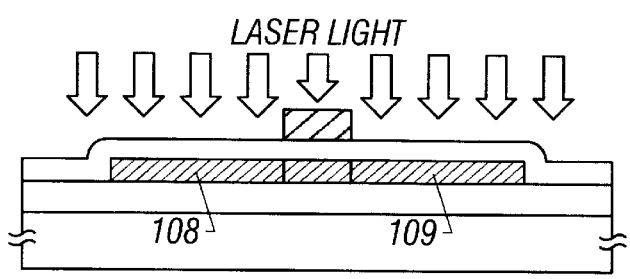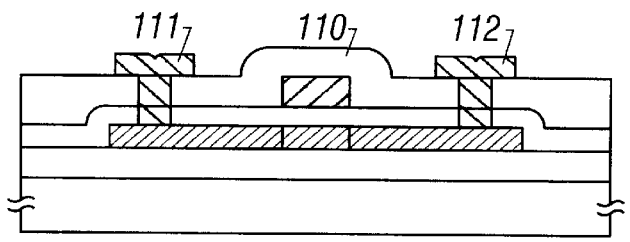

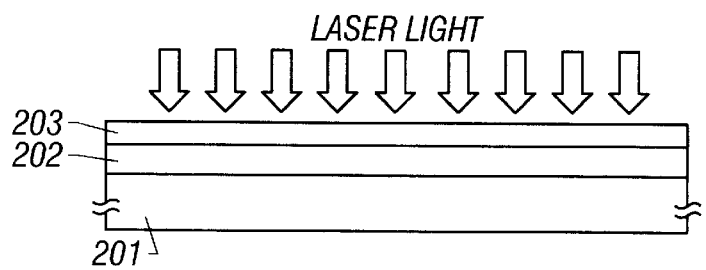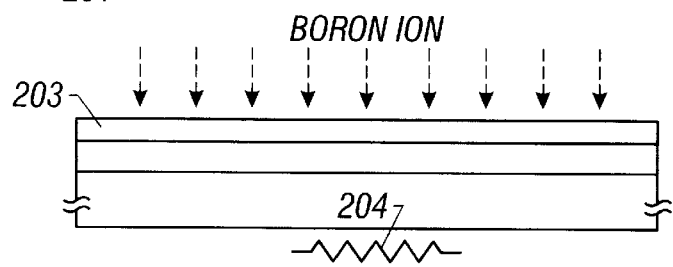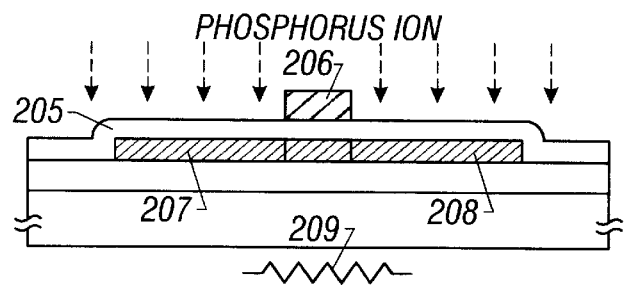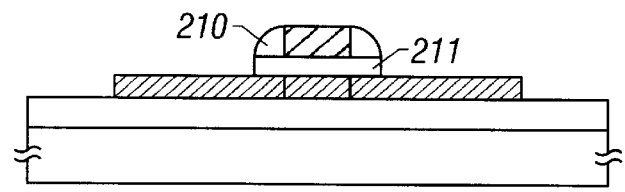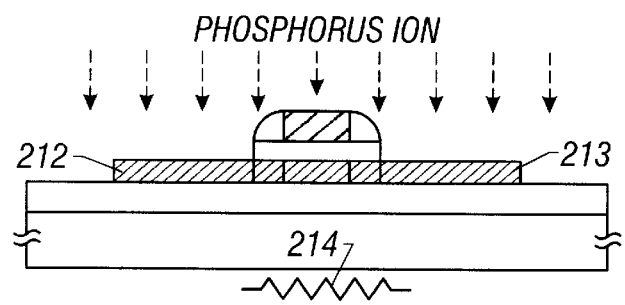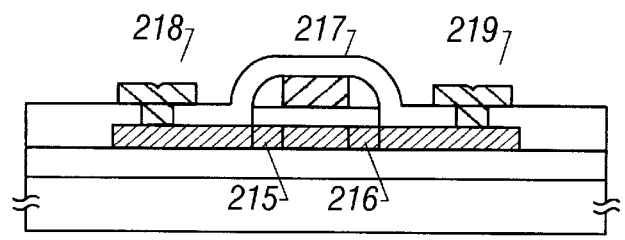

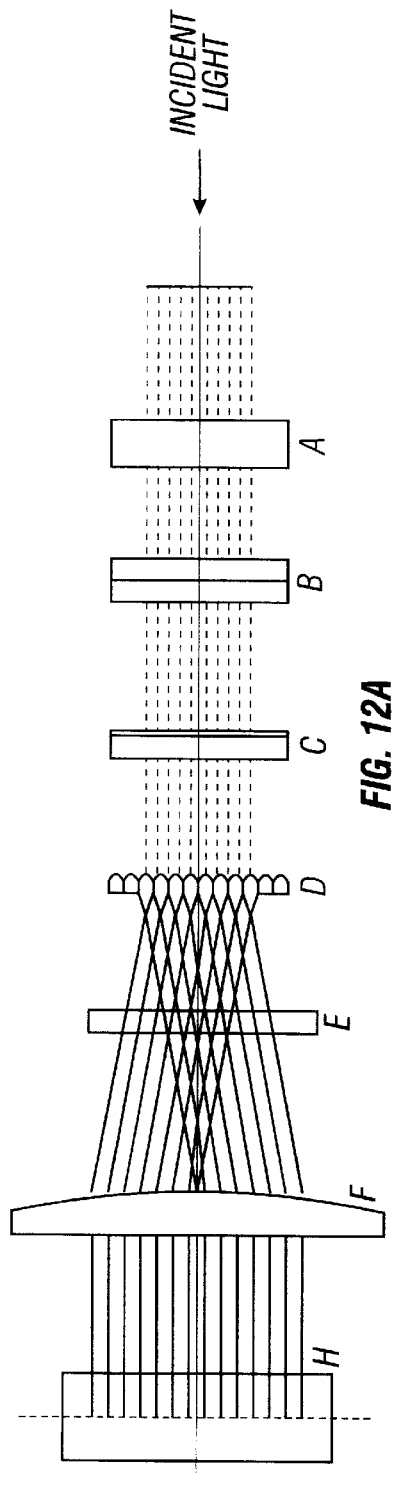
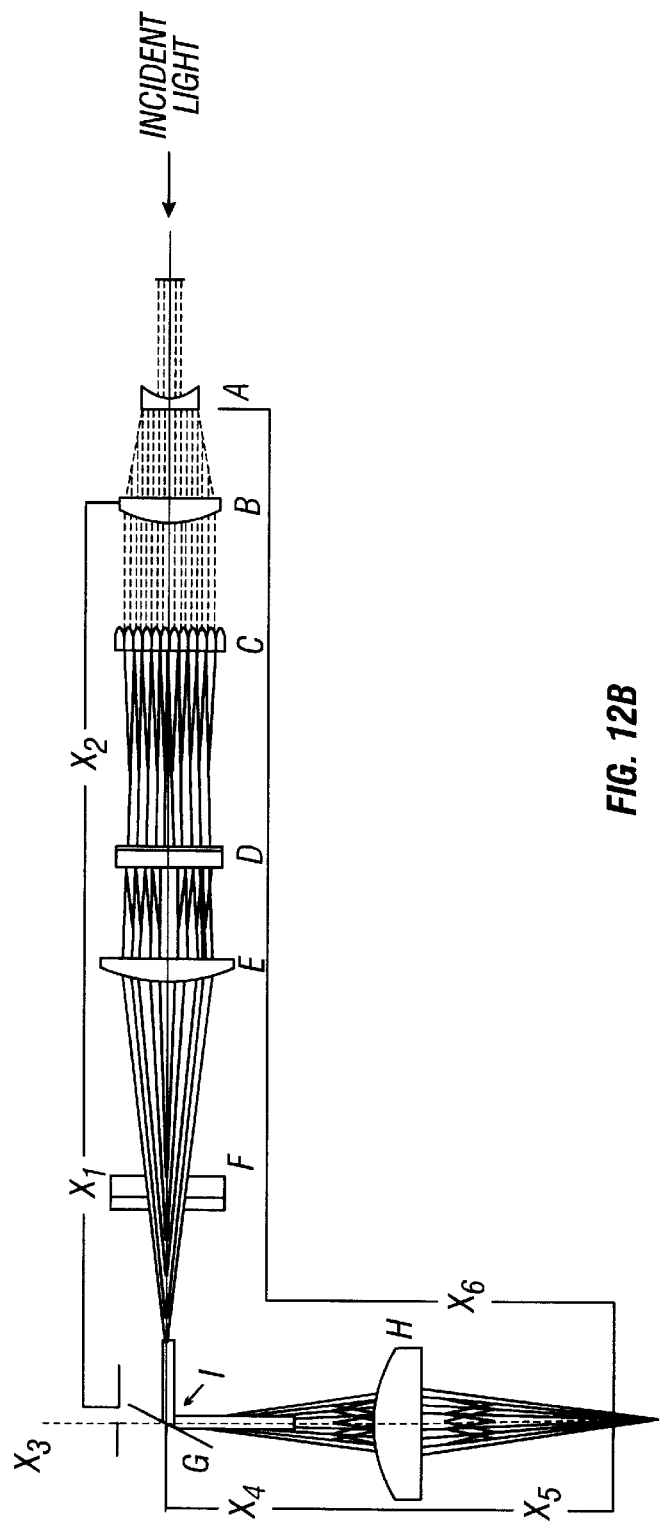
FIG. 12A
FIG. 12B

METHOD OF DOPING CRYSTALLINE SILICON FILM

BACKGROUND OF THE INVENTION

1. Field of the Invention

The present Invention relates to a method of producing an insulated gate semiconductor element or other semiconductor devices, such as a thin film transistor (TFT) having a non-single crystalline silicon film, and particularly to a doping method for controlling a threshold value voltage. The present invention is applied to a semiconductor device formed on an insulating substrate made of glass or the like, or on a semiconductor substrate made of single crystal silicon, etc.

2. Description of the Related Art

A doping technique applied to a semiconductor material has three main effects described below.

1) Doping to the source and drain regions of a transistor.

A purpose of doping the source and drain regions of a transistor formed on a semiconductor material (for example, implanting phosphorus or boron in silicon) is to produce carriers (electrons or holes) in the semiconductor material, to thereby remarkably increase an on-current of the transistor. In producing an n-type semiconductor region by implanting phosphorus in the source and drain regions of the TFT, n-type semiconductor region that allows the TFT to operate cannot be formed without implanting phosphorus in the semiconductor material at $1 \times 10^{19}$ to $1 \times 10^{21}$ atoms/cm$^3$.

2) Doping to the channel region of a transistor.

A technique of doping the channel region of a transistor is has been widely known and is called "channel dope". This is used in practice to control a threshold voltage value "$V_{th}$". $V_{th}$ of an intrinsic semiconductor material is originally 0 V. However, there is a case in which $V_{th}$ is shifted from 0 for the reason that the semiconductor material is processed to improve the crystallinity or homogeneity of the semiconductor material, or for other reasons. The channel dope allows such a shift of $V_{th}$ to return to 0 V.

When $V_{th}$ is shifted to the minus side, p-type ions, e.g., boron ions are implanted as a dopant to make $V_{th}$ shift to the plus side. When $V_{th}$ is shifted to the plus side, n-type ions, e.g., phosphorus ions are implanted as a dopant to make $V_{th}$ shift to the minus side. It is required that the dose of impurity ions to be implanted is properly adjusted in accordance with the degree of shift of $V_{th}$. In general, the dose of impurity ions implanted in the channel region is smaller than that implanted in the source and drain regions.

3) Doping to the LDD (lightly doped drain) region of a transistor.

An LDD technique has such effects that the deterioration of a transistor is prevented or an off-current is reduced. In the LDD technique, LDD regions are formed between source and drain regions and a channel region, and the dose smaller than that implanted in the source and drain regions is implanted in the LDD regions. Thus, the LDD regions having an intermediate characteristic in the physical property (mainly the electric physical property) between the source and drain regions and the channel region are formed. This causes one cushion to be produced in a difference in the physical property between the source/drain regions and the channel region. Therefore, the off-current is reduced, and the deterioration of the transistor characteristic is suppressed.

The main effects of doping are described above. A large amount of dopant is implanted in the semiconductor material to thereby form a lattice defect. In general, a doped region is made amorphous. Hence, in general, an annealing process is required to repair the lattice defect after doping.

(Process for attaining the present invention)

A method by which a TFT having a crystalline silicon film formed on a glass substrate is produced at a low temperature has been demanded. This is required to obtain the active matrix liquid crystal display at the low production costs.

Recently, insulated gate semiconductor devices having a thin film shaped active layer (also called "an active region") on an insulating substrate have been researched. In particular, thin film shaped insulated gate transistors, so-called TFT have been researched eagerly. They are classified into an amorphous silicon TFT, a crystalline silicon TFT and so on, depending on the material or the crystal state of a semiconductor to be used. The crystalline silicon is directed to non-single crystal which is not of single crystal. Thus, they are generally called a non-single crystal silicon TFT.

In general, a semiconductor in an amorphous state has a small electric field mobility and cannot be used for a TFT requiring a high speed operation. Since amorphous silicon has a remarkable small p-type electric field mobility, it cannot be formed into a p-channel TFT (PMOS TFT), and amorphous silicon cannot be formed into a complementary MOS (CMOS) circuit in combination with an n-channel TFT (NMOS TFT).

A crystalline semiconductor is larger in electric field mobility than an amorphous semiconductor, to enable a high speed operation. Since crystalline silicon can be formed into NMOS TFT as well as PMOS TFT, a CMOS circuit can be produced.

To obtain a crystalline silicon film, it is required that an amorphous silicon film formed by plasma CVD is heated at 600° C. or higher for several tens hours or longer. However, when a glass substrate is normally exposed to 600° C. or higher for a long time, it cannot be used as a substrate for forming a thin film semiconductor device formed by a semiconductor thin film having a thickness of about several hundreds Å because of remarkable deformation (distortion) or shrinkage. Although there exists a glass substrate that withstands a high temperature of 600° C. or higher, it is expensive and greatly causes the production costs to increase.

A known example of low temperature crystallizing techniques is of a technique by which an amorphous silicon film is crystallized by the irradiation of a laser light. However, since it requires a high output laser beam over a large area, there arises a problem from the viewpoints of the production costs and the productivity. Also, when a crystalline silicon film is obtained by only the irradiation of a laser light, the characteristics are dispersed.

What is required under such a condition is a technique in which a crystalline silicon film is obtained by a heat treatment at a temperature which can be withstood by the glass substrate. In such a technique, as disclosed in Japanese Patent Unexamined Publication Nos. 6-232059 and 6-244104 by the present applicant, a crystalline silicon film can be obtained by thermal annealing at a lower temperature for a shorter period of time than a usual case by using such an effect that elements such as nickel, iron, cobalt, platinum or palladium (hereinafter referred to as "crystallization catalyst element or simply "catalyst element") promotes the crystallization of amorphous silicon. When nickel is used as a catalyst element, a crystalline silicon film can be obtained by thermal annealing at about 550° C. for about 4 hours.

The like technique is disclosed in Japanese Patent Unexamined Publication Nos. 6-318701 and 6-333951 and so on.

It is found that, in the silicon film having such a crystallization catalyst element, an impurity element in an impurity region of source/drain regions or the like which is formed by the irradiation and implantation of n-type or p type impurity ions by ion doping or the like can be activated by thermally annealing at a lower temperature than that of a conventional method (Japanese Patent Unexamined Publication Nos. 6-267980 and 6-267989). To achieve the above, it is preferable that the concentration of catalyst elements is $1 \times 10^{15}$ to $1 \times 10^{19}$ atoms/cm$^3$.

In a lower concentration that does not reach the above range, the crystallization cannot be promoted whereas in a higher concentration that exceeds the above range, it adversely affects the silicon semiconductor characteristic. The concentration of the catalyst elements in this case is of a value analyzed by the secondary ion mass spectrometry (SIMS), and in most of cases, the catalyst elements have a distribution in a film, and the above value denotes a lowest value of the catalyst elements in the silicon film.

However, it is frequently observed that a threshold value voltage is shifted in the semiconductor device produced using crystalline silicon. In most of cases, the threshold value voltage is shifted in a negative direction, but there is some cases where it is shifted in a positive direction. In a device using a coating formed by the vapor growth method such as plasma CVD with tetraethoxysilane (TEOS, chemical formula Si(OC$_2$H$_5$)) as a gate insulating film, most of the threshold value voltage are shifted in the negative direction. Also, it is observed that even in the crystalline silicon film obtained using a catalyst element, the threshold value is shifted in the negative direction.

It is assumed that the above phenomenon is derived from a defect existing between a silicon film and a gate insulating film, an impurity (carbon, nitrogen, etc.) in the gate insulating film, a localized center, etc. In the crystalline silicon film using a catalyst metal element, that $V_{th}$ is shifted in the negative direction means that a channel forming region becomes the n-type even with a difference of some degree. A variety of metal elements can be recited as an element that puts a silicon semiconductor into a weak n-type (in other words, it can exhibit the state of putting it into the weak n-type). Hence, it is concluded that a cause of putting it into the n-type is a metal element introduced for promoting the crystallization.

As described in the above conventional example, the threshold value voltage can be controlled by doping a semiconductor with a very small amount of n-type or p-type impurity. Thus, it has been expected that the like technique could be applied even to the semiconductor device using crystalline silicon, and such application has been tried. However, the threshold voltage value has been hardly improved.

That is, in the conventional semiconductor integrated circuit technique, an ion having the n-type or p-type impurity at a required amount are accelerated and implanted into the semiconductor. After that, the crystal property is recovered and the implanted impurity is activated, by thermal annealing (500° C. or higher, normally about 1000° C.). However, when the same method is applied to the crystalline silicon film, the threshold value does not fluctuate at all when the concentration of the impurity is $1 \times 10^{18}$ atoms/cm$^3$ or less, but it fluctuates rapidly with a boundary of $1 \times 10^{18}$ atoms/cm$^3$ and becomes the n-type or p-type substantially. This cannot be used in a channel of a TFT or the like.

In amorphous silicon, there has been known that a small amount of n-type or p-type impurity is added to the semiconductor at forming a film, thereby being capable of controlling the threshold value. Thus, an attempt has been made to form a crystalline silicon film using an amorphous silicon film to which a small amount of impurity is added in the same manner. However, similarly even in this case, the threshold value does not fluctuate at all when the concentration of the impurity is $1 \times 10^{18}$ atoms/cm$^3$ or less, but it. fluctuates rapidly with a boundary of $1 \times 10^{18}$ atoms/cm$^3$, an intermediate threshold value cannot be obtained.

The above phenomenon completely differs from such a phenomenon that the threshold value fluctuates continuously gently by adding the impurity at a concentration of $1 \times 10^{15}$ to $1 \times 10^{18}$ atoms/cm$^3$, as observed in the conventional semiconductor integrated circuit technique or the amorphous silicon technique. It has been considered that it is impossible to control the threshold value in the crystalline silicon because of this phenomenon.

When $V_{th}$ is shifted to the negative side, the power of the gate electrode and the semiconductor region in the TFT has a large difference between the devices. This leads to a serious drawback in the TFTs arranged in the form of a pixel matrix. Thus, it is necessary that boron is added to the channel forming region to adjust $V_{th}$ to 0 V.

SUMMARY OF THE INVENTION

The present invention has been made in view of the above problems. An object of the present invention is to provide a method of controlling a threshold value in a semiconductor device using a crystalline silicon film, in particular, to provide a method of controlling a threshold value of a thin film transistor (TFT) using a crystalline silicon film crystallized by introducing a metal element having a catalyst function that promotes the crystallization of silicon.

Another object of the present invention is to provide a doping method that requires no thermal annealing process and lowers an energy necessary for annealing.

To solve the above problems, a first aspect of the present invention is characterized in that, after an ion having n-type or p-type impurity necessary for a crystalline silicon film is implanted by a known ion implantation or ion doping (also called "plasma doping"), a laser light or an equivalent intense light is irradiated onto the crystalline silicon film, to thereby improve the crystallinity of the silicon film and activate the impurity, and in the succeeding process, the silicon film is not thermally annealed at 450° C. or higher.

A second aspect of the present invention is characterized in that, under a state where a substrate is heated at 50 to 500° C., preferably 200 to 350° C., an ion having n-type or p-type impurity necessary for a crystalline silicon film is implanted by the ion doping, and in the succeeding process, the silicon film is not thermally annealed at 450° C. or higher.

The crystalline silicon film used in the first and second aspects may be formed by the thermal annealing or the optical annealing. The thermal annealing and the optical annealing may be used together. A catalyst element such as nickel, platinum, cobalt, iron or palladium may be used. In the first and second aspects, when annealing is conducted in hydrogen or halogen atmosphere in the succeeding process, the effect is more promoted. The concentration of impurity implanted in the silicon film is $1 \times 10^{15}$ to $3 \times 10^{18}$ atoms/cm$^3$, or ¼ to 4 times as much as the spin concentration of the silicon film measured by electronic spin resonance (ESR).

From the above viewpoints, there are some possible combinations of the present invention. A first case is that the first or second aspect is put into practice after the thermal annealing process. A second case is that the first or second aspect is put into practice after the optical annealing process, and the intensity of a succeeding optical annealing is higher than that of an initial optical annealing. A third case is that the first or second aspect is put into practice after the optical annealing process, and the intensity of a succeeding optical annealing can be set to be lower to the degree of removing damages by the irradiation of the impurity ion than that of an initial optical annealing.

The present invention may be applied to the whole surface of the substrate, or, for example, selectively to only an n-channel TFT or only a specified circuit.

In the conventional two methods, a process of crystallizing the silicon film is performed after the introduction of the n-type or p-type impurity. According to the research by the inventors, it has been found that the impurity introduced by this process is moved and selectively produced on a grain boundary. This cannot be assumed from single crystal that a material is homogeneous or amorphous. Thus, the impurity introduced homogeneously becomes increases on the grain boundary but decreases on the center portion of crystal, causing a heterogeneity. In particular, boron is liable to be diffused into silicon oxide, etc., rather than silicon crystal. Hence, boron has a strong tendency to be discharged from silicon crystal toward the external and to be produced on the grain boundary.

The impurity produced on the grain boundary having a lot of defects is mainly used to embed a defective dangling bond, and the ratio of activation is extremely lowered. Since it is presumed that the density of defects in crystalline silicon is about $1 \times 10^{18}$ atoms/cm$^3$, the introduced impurity is mainly absorbed on the gain boundary until the concentration of impurity becomes about $1 \times 10^{18}$ atoms/cm$^3$, so that the impurity can be hardly activated. Hence, the threshold value of crystalline silicon is hardly changed.

When impurities having a concentration of about $1 \times 10^{18}$ atoms/cm$^3$ or higher is introduced, the impurities are not entirely absorbed on the gain boundary. That is, the remaining impurities are activated in the silicon crystal, to provide conductivity. However, the degree of the concentration of impurities to be activated is extremely inhomogeneous even within the silicon film, so that it is impossible to finely control the threshold value.

From the above, the thermal annealing must not be conducted after the introduction of impurity. From researching by the present inventors, with annealing at 450° C. or higher, an impurity element is moved to cause the above phenomenon. Thus, in the present invention, the thermal annealing at 450° C. or higher is not conducted after the introduction of impurity. The first aspect of the present invention resides in that the optical annealing with a pulse light source is used to recover the crystallinity decreased by the introduction of impurity. In researching by the inventors, it is preferable that a pulse width is 1 μsec or less. When a light having a pulse width of 1 μsec or more is irradiated, the impurity element is moved although depending on the intense of a light. When the pulse width is 1 μsec or less, the movement of impurity elements can be satisfactorily suppressed.

According to the first aspect, it is necessary that the introduction of an impurity ion and the irradiation of laser light, etc., are continuously conducted. For example, the mass productivity can be improved by using a multichamber unit into which a chamber for an ion doping unit and a chamber for a laser processing are integrated, as disclosed in FIG. 9 of Japanese Patent Unexamined Publication No. 6-260436.

In general, the ion implantation causes great damage to crystal, thereby requiring the recovery of crystalline property by thermal annealing. However, there is a case in which a specified method hardly causes damage to the crystalline property so that thermal annealing as well as optical annealing is not required.

It has been reported that, when a substrate is heated at 200° C. in the ion doping process, the activation by the thermal annealing, etc., is unnecessary in the subsequent process (Y. Mishima et al: J. Appl, Phys. 74 (193)7114).

As a result that the present inventors reviewed this research in detail, they have found that no defect has remained after the ion doping is conducted because the defects by the introduction of an ion are immediately repaired (in that state). Also, with respect to a temperature range, the present inventors have found that no defect occurs when the ion doping is conducted while the temperature of a substrate is 50 to 500° C., preferably 200 to 350° C. When a hydrogen ion or a halogen ion is introduced in addition to the impurity ion, the activation can be more effectively conducted.

Heating the substrate may be made while the introduction of the impurity ion. Or, the substrate may be heated immediately before the introduction of impurity ion so as not to be heated intentionally at the introduction of an impurity ion. In the latter case, although the substrate temperature is lowered as a time elapses, 50 to 500° C. can be held during a normal doping operation by sufficiently heat insulation.

Such a doping unit may be provided with a chamber having unit for heating a substrate and a chamber having no unit for effectively heating the substrate. A diagram of such the doping unit is shown in FIG. 5. The doping unit roughly includes three chambers, that is, a first preliminary chamber (a substrate introduction chamber) 501, a doping chamber 502 and a second preliminary chamber (a substrate ejection chamber) 503. Each of those chambers is provided with a mechanism for setting an internal pressure to a desired value.

The first preliminary chamber 501 is provided with a susceptor 504 having a heater for heating a substrate 505 to a desired temperature. The doping chamber 502, as in the general ion doping unit, is provided with a doping gas introducing system 510, a doping gas exhaust system 511, a substrate holder 506, a plasma room 508, and a control electrode 509 for acceleration, etc. A substrate 507 is disposed on the substrate holder 506. A processed substrate 512 is taken out from the second preliminary chamber 503.

If the first preliminary chamber 501 serves as a unit for introducing and taking out the substrate, it is unnecessary to provide the secondary preliminary chamber 503. In the first preliminary chamber, the substrate is heated to a desired temperature. What is important resides not in a temperature to which the substrate is heated in the first preliminary chamber 501, but in that the substrate is heated in the doping chamber 502 when doping, in particular, a semiconductor region to be doped is heated to 50 to 500° C., preferably to 200 to 350° C.

In the present invention, doping and heating are performed simultaneously, so that it is unnecessary to conduct the activation process by thermal annealing after the doping process without any occurrence of a defect or distortion in the silicon film due to dopant, as disclosed in Mishima et al Or, since a thermal energy as required can be lowered, the activation process is finished in a very short period, thereby being capable of improving the mass productivity. Also, it is effective to conduct annealing by a laser light or an intense light after doping.

In the doping process for the semiconductor device that requires a high characteristic as in a liquid crystal display, it is insufficient to conduct only the doping process while the above heating. This is because a lattice defect of the type which is not repaired without giving a thermal energy corresponding to 1000° C. or higher is produced in the doping process.

What corresponds to thermal energy of 1000° C. or higher and can anneal only a semiconductor thin film portion with little rising of the temperature of the glass substrate is only an optical energy in the circumstances. In the present invention, a process of irradiating an intense energy such as a laser is added after the doping process, to improve the characteristics of the semiconductor material and the homogeneity of dopant in the semiconductor material. Since a time required to irradiate a laser is several minutes, the addition of this process hardly affect the throughput. A pulse laser having a pulse width of 10 nsec or less may be used, and to further increasing the throughput, a laser can be processed linearly. The details will be described in a second embodiment.

Also, since the TFT using a crystalline silicon film crystallized with a metal element that promotes the crystallization of silicon has a channel forming region of a weak n-type, the channel forming region can provide the substantially intrinsic characteristic or the characteristic substantially close to the intrinsic characteristic by doping the channel forming region with an impurity for providing the p-type, specifically boron ion. Thus, the shift of $V_{th}$ can be corrected. The above annealing due to the irradiation of a laser light is conducted after the doping process of the present invention, to improve the reproducibility and effect.

In the present invention described in the specification, to obtain the effect of controlling the threshold value, it is preferable that dopant is implanted in the silicon film at a concentration of $1 \times 10^{15}$ to $3 \times 10^{18}$ cm$^{-3}$. The silicon film used in the present invention is a film containing mainly silicon. Hence, it is preferable that the dopant is implanted into the silicon film at a concentration of ¼ times to 4 times as much as the spin concentration of the silicon film, measured by electronic spin resonance (ESR). The spin concentration of the silicon film is typically about $1 \times 10^{16}$ to $1 \times 10^{18}$ cm$^{-3}$. When the spin concentration of the silicon film is $5 \times 10^{17}$ cm$^{-3}$, dopant is implanted into the silicon film at a concentration of $1.2 \times 10^{17}$ to $2.0 \times 10^{18}$ cm$^{-3}$. The concentration of dopant is of a value measured by the secondary ion mass spectrometry (SIMS).

In the present invention, a silicon oxide film is formed on the surface of a crystalline silicon film to adjust the concentration of impurity to be doped. It is hard to directly implant an impurity ion into the silicon film at a concentration of about $1 \times 10^{17}$ cm$^{-3}$ by a doping unit. Thus, an impurity is doped using the silicon oxide film as a translucent mask film, whereby boron can be implanted into the silicon film at a low concentration of about $1 \times 10^{17}$ cm$^{-3}$. For that reason, the silicon oxide film is preferably formed at a thickness of 100 to 1500 Å. Then, the silicon oxide film is removed after the doping process so that the crystalline silicon film is exposed therefrom to form a TFT.

According to the experience of the present inventors, it has been found that a TFT having a desired characteristic is obtained in the case where the channel dope is performed with a dose smaller than the concentration of impurity implanted in the source/drain, and the dopant exists in the silicon film at a concentration of $1 \times 10^{15}$ to $3 \times 10^{18}$ cm$^{-3}$.

BRIEF DESCRIPTION OF THE DRAWINGS

FIGS. 1A to 1F are cross-sectional views of a producing process in accordance with a seventh embodiment of the present invention;

FIGS. 2A to 2F are cross-sectional views of a producing process in accordance with an eighth embodiment;

FIGS. 12A to 12C are a structural diagram of an optical system for processing a laser light linearly in the sixth embodiment.

DETAILED DESCRIPTION OF THE PREFERRED EMBODIMENTS (First Embodiment)

A first embodiment will be described with FIGS. 7 and 8. A base silicon oxide film having a thickness of 2000 Å is formed on the substrate of No. 7059 glass made by Corning Company, and an amorphous silicon film having a thickness of 500 Å is formed on the base silicon oxide film, continuously by plasma CVD. Nickel acetate aqueous solution of 10 ppm is applied on the silicon surface to form a nickel acetate layer. It is preferable that a surface active agent is added to nickel acetate aqueous solution. Since the nickel acetate layer is very thin, it is not always in the form of a film. However, it does not lead to a problem in the subsequent processes.

The silicon film is crystallized by thermally annealing at 550° C. for 4 hours. In this case, nickel functions as a catalyst element that promotes the crystallization of amorphous silicon. The details are disclosed in Japanese Patent Unexamined Publication No. 6-244104.

The concentration of the catalyst element is preferably $1 \times 10^{15}$ to $1 \times 10^{19}$ atoms/cm$^3$. The high concentration of $1 \times 10^{19}$ atoms/cm$^3$ or more gives silicon a metal property, so that the semiconductor characteristic disappears. In analyzing the concentration of the catalyst element by secondary ion mass spectrometry (SIMS), the minimum value of the concentration in the silicon film is $1 \times 10^{17}$ to $5 \times 10^{18}$ atoms/cm$^3$.

In this way, the crystallized silicon film is obtained. In order to further improve the crystallinity, a KrF excimer laser (wavelength of 248 nm, pulse width of 30 nsec) is irradiated. The energy density of the laser is 150 to 250 mJ/cm$^2$, e.g., 220 mJ/cm$^2$, and a laser light of 2 to 20 shots is irradiated for each portion of the silicon film. The substrate temperature when irradiating a laser is 200° C.

A silicon oxide film having a thickness of 1200 Å is deposited on the silicon film by plasma CVD. The silicon oxide film functions as a protective film (see a right figure in FIG. 7). In this state, boron is introduced by the ion doping. The doping gas is diborane ($B_2H_6$) of 5% diluted with hydrogen, and an accelerating voltage is 30 kV. The dose is changed from $6 \times 10^{12}$ to $2 \times 10^{14}$ atoms/cm$^2$.

Figure 7:
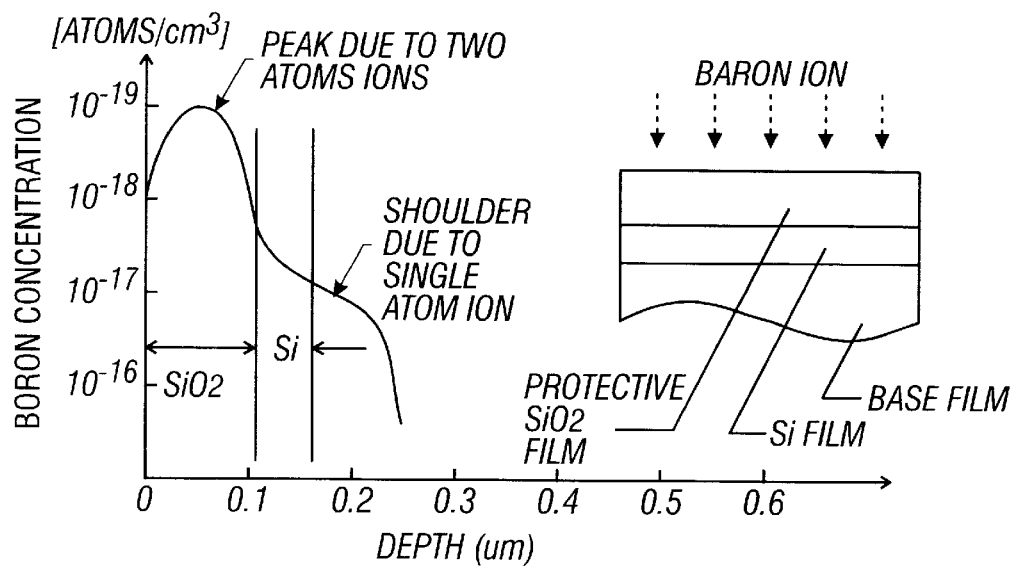
FIG. 7 shows the distribution of concentration of doped boron in a depth direction.

FIG. 7 shows a typical concentration profile when boron is introduced by the ion doping (accelerating voltage is 30 kV) Boron has a peak in the vicinity of the surface, but also has a shoulder at a deeper portion. It is considered that the former (peek) is derived from a heavy ion seed (such as $B_2H_5^+$, etc.) containing mainly molecules constructed by two boron atoms, whereas the latter (shoulder) is derived from a light ion seed (such as $BH_2^+$, etc.) containing mainly one boron atom.

In any case, since a shoulder exists in the distribution of a boron concentration, a change of the concentration at this region is gentle. In this embodiment, a low concentration doping is conducted using boron in the shoulder region. In FIG. 7, a high concentration boron region mainly exists in a protective silicon oxide film, and the shoulder region having a lower concentration is in the silicon film.

After the doping process, the protective silicon oxide film is removed, and the KrF excimer laser is again irradiated to conduct the activation. The energy density of the laser is 250 to 400 mJ/cm$^2$, e.g., 370 mJ/cm$^2$. A laser light of 2 to 20 shots is irradiated for each portion of the silicon film. The substrate temperature is 200° C.

Figure 8:
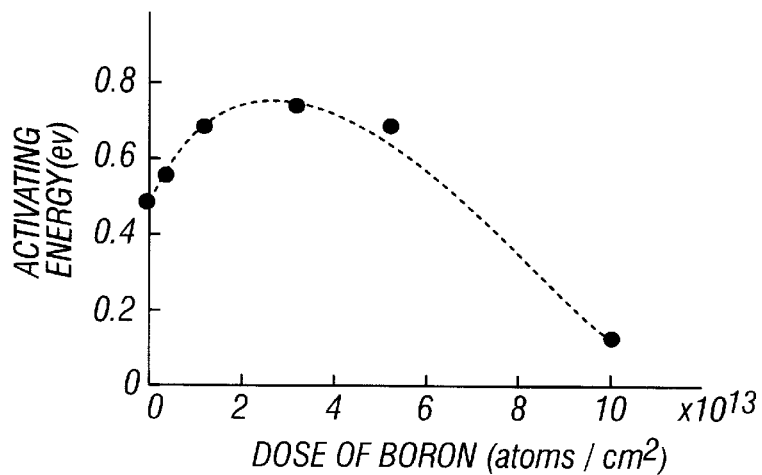
FIG. 8 shows a relationship between the activation energy of a silicon film and a dose.

The optical physical property of the crystalline silicon film formed in the above manner is measured and a dependency of the activating energy on the dose is investigated, so that a relationship in FIG. 8 is obtained. The activating energy is increased with an increase of the dose, but has a peak in the vicinity of the dose of $3\times10^{17}$ atoms/cm$^2$ and the activating energy is reduced after the dose exceeds that value. It is explained that this is because the silicon film which is initially of a weak n-type becomes substantially intrinsic in the vicinity of the dose of $3\times10^{17}$ atoms/cm$^2$, and thereafter it is gradually shifted to the p-type.

(Second Embodiment)

As in the first embodiment, a base silicon oxide film having a thickness of 2000 Å is formed on a glass substrate, and an amorphous silicon film having a thickness of 500 Å is formed on the base silicon oxide film, continuously by plasma CVD. The silicon film is crystallized by thermally annealing at 600° C. for 24 hours. A protective silicon oxide film having a thickness of 1200 Å is deposited by plasma CVD. Then, boron is introduced by the ion doping. The doping gas is diborane ($B_2H_6$) of 5% diluted with hydrogen. An accelerating voltage is 30 kV. The dose is changed from $6\times10^{12}$ to $2\times10^{14}$ atoms/cm$^2$.

After the doping process, the protective silicon oxide film is removed, and the KrF excimer laser is again irradiated to activate the silicon film. The energy density of the laser is 250 to 500 mJ/cm$^2$, e.g., 400 mJ/cm$^2$. A laser light of 2 to 20 shots is irradiated for each portion of the silicon film. The substrate temperature is a room temperature.

As a result of measuring the optical physical property of the crystalline silicon film formed in the above manner and investigating a dependency of the activating energy on the dose, the same relationship as that in the first embodiment is obtained. The relationship is exhibited that the silicon film which is initially of a weak n-type became intrinsic with an increase in the dose and thereafter is shifted to the p-type.

(Third Embodiment)

As in the first embodiment, a base silicon oxide film having a thickness of 2000 Å is formed on a glass substrate, and an amorphous silicon film having a thickness of 500 Å is formed on the base silicon oxide film, continuously by plasma CVD. A nickel acetate layer is formed on the amorphous silicon film, and the silicon film is crystallized by thermally annealing at 550° C. for 4 hours. A protective silicon oxide film having a thickness of 1200 Å is deposited by plasma CVD. Then, boron is introduced by the ion doping. The doping yas is diborane ($B_2H_6$) of 5% diluted with hydrogen. An accelerating voltage is 30 kv. The dose is changed from $6\times10^{12}$ to $2\times10^{14}$ atoms/cm$^2$. In doping, the substrate temperature is 100 to 400° C., e.g., 250° C.

As a result of measuring the optical physical property of the crystalline silicon film formed in the above manner and investigating a dependency of the activating energy on the dose, the same relationship as that in the first embodiment is obtained. The relationship is exhibited that the silicon film which is initially of a weak n-type became intrinsic with an increase in the dose and thereafter is shifted to the p-type.

Even when the protective silicon oxide film is removed after doping and the KrF excimer laser is again irradiated, the same characteristic is obtained. In this case, it is better that the energy density of the laser is 150 to 250 mJ/cm$^2$ and the substrate temperature is a room temperature.

(Fourth Embodiment)

As in the first embodiment, a base silicon oxide film having a thickness of 2000 Å is formed on a glass substrate, and an amorphous silicon film having a thickness of 500 Å is formed on the base silicon oxide film, continuously by plasma CVD. The silicon film is crystallized by irradiating the KrF excimer laser. It is better that the energy density is 450 to 600 mJ/cm$^2$ and the substrate temperature is 350° C. A protective silicon oxide film having a thickness of 1200 Å is deposited by plasma CVD. Then, boron is introduced by ion doping. The doping gas is diborane ($B_2H_6$) of 5% diluted with hydrogen, and an accelerating voltage is 30 kV. The dose is changed from $6\times10^{12}$ to $2\times10^{14}$ atoms/cm$^2$. In doping, the substrate temperature is 100 to 400° C., e.g., 250° C.

As a result of measuring the optical physical property of the crystalline silicon film formed in the above manner and investigating a dependency of the activating energy on the dose, the same relationship as that in the first embodiment is obtained. The relationship is exhibited that the silicon film which is initially of a weak n-type became intrinsic with an increase in the dose and thereafter is shifted to the p-type.

Even when the protective silicon oxide film is removed after doping and the KrF excimer laser is again irradiated, the same characteristic is obtained. In this case, it is preferable that the energy density of the laser is 150 to 250 mJ/cm$^2$ and the substrate temperature is a room temperature.

(Fifth Embodiment)

In this embodiment, a channel doping process is performed during a TFT producing process, which exhibits a method of producing a TFT particularly having an excellent characteristic. Specifically, this embodiment exhibits a producing method which is excellent in the controllability of $V_{th}$, and which reduces the dispersion of $V_{th}$ in producing a plurality of TFTs on the same substrate. A description will be given to processes until a channel doping process, but processes after the channel doping process to the completion of the TFT are described below. The transistor can be formed from the film obtained in this embodiment by a general method.

A TFT before being doped under producing is prepared. TN the state where the TFT is being produced, a silicon oxide film having a thickness of 3000 Å is formed on a glass substrate (Corning 7059) as a base layer, a crystalline silicon film having a thickness of 500 Å is formed on the silicon oxide film, and a silicon oxide film having a thickness of 1200 Å is formed on the crystalline silicon film. The thickness of those films may be set to a required one.

A method of forming the crystalline silicon film will be described below. A silicon oxide film having a thickness of 3000 Å is formed on a glass substrate as a base layer by sputtering or plasma CVD. An amorphous silicon film having a thickness of 500 Å is formed by plasma CVD or low pressure thermal CVD. a nickel element used as a catalytic metal element that promotes the crystallization of silicon is introduced by coating (adding) nickel acetate solution. In this state, the nickel element is held in contact with the surface of the amorphous silicon film. A crystalline silicon film is obtained by heating the amorphous silicon film at 550° C. for 4 hours.

A silicon oxide film is formed at a thickness of 1200 Å. The silicon oxide film used to control the amount of impurity implanted in the channel to a reduced value. The details will be described later. The reason why the channel doping is conducted in this stage is that, since the channel portion of the transistor is normally formed below a gate electrode, the doping must be conducted before forming the gate electrode. In this embodiment, since the crystalline silicon film is formed using a catalyst element, boron is implanted into the channel forming region to control the threshold voltage value. The silicon film in this specification is of a film containing mainly silicon.

Thus, it is preferable that boron is implanted into the silicon film at a concentration of ¼ times to 4 times as much as the spin concentration of the silicon film, measured by electronic spin resonance (ESR). The spin concentration of the silicon film is about $1\times10^{16}$ to $1\times10^{18}$ cm$^{-3}$, typically $1\times10^{17}$ cm$^{-3}$. When the spin concentration of the silicon film is $1\times10^{17}$ cm$^{-3}$, a suitable concentration of boron in the silicon film is $2.5\times10^{16}$ to $4.0\times10^{17}$ cm$^{-3}$, and when the spin concentration of the silicon film is $5\times10^{17}$ cm$^{-3}$, a suitable concentration of boron is $1.2\times10^{17}$ to $2.0\times10^{18}$ cm$^{-3}$.

Figure 9:
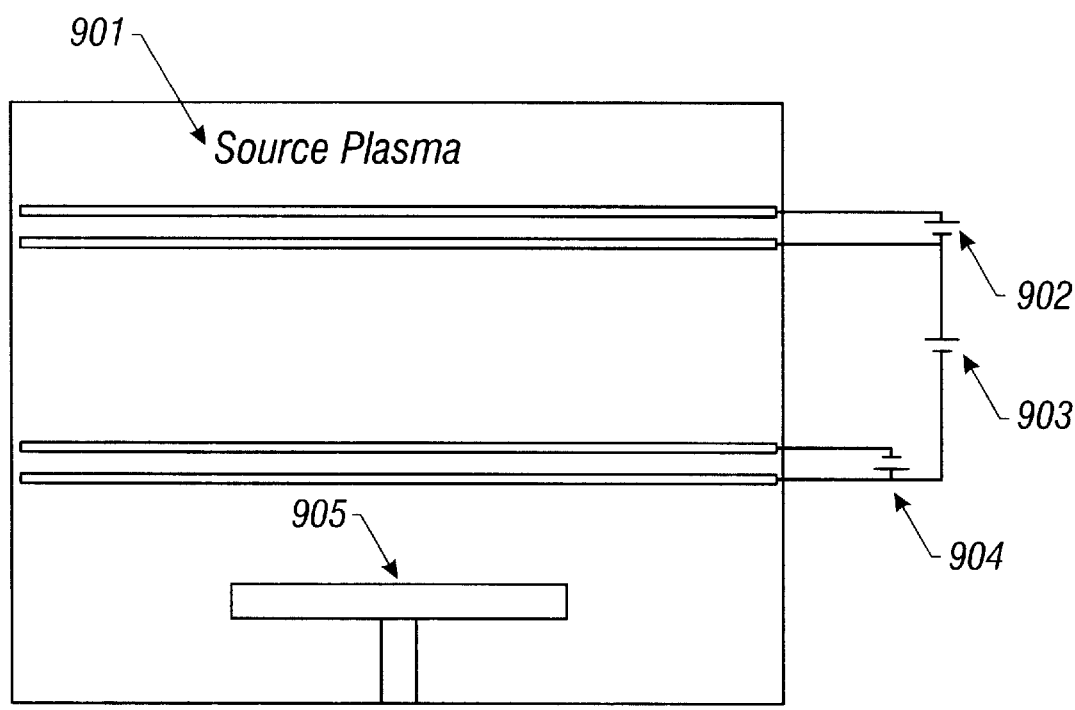
FIG. 9 shows an outline of a doping unit.

FIG. 9 is a schematic diagram of a doping unit of this embodiment. Plasma produces in an uppermost plasma source 901, and ions generated in the plasma are accelerated in an ion accelerating region below the plasma source 901 by applying a voltage to the ion accelerating region. A voltage can be applied at three points called a draw out voltage source 901, an accelerating voltage source 902 and a decelerating voltage source 904 in the order from the upper. In actually doping, a voltage is applied in the order from the lower. A substrate holder 904 is equipped with a heater for holding the substrate to an arbitrary temperature.

In the doping of this embodiment, since boron (B) is used as dopant, a diborane gas of 0.1 to 5% diluted with hydrogen or helium is used. In this embodiment, a diborane gas of 1% diluted with helium is used. Helium has an action to perform uniform doping to reduce the dispersion of doping.

A diborane gas is introduced into the plasma source 901 of the doping unit of FIG. 9, and a substrate (glass substrate) on which a TFT under manufacture before being doped is formed is mounted on a substrate holder 505. In this state, the temperature of a heater of the substrate holder 905 is 50 to 500° C. With a temperature being held at high, the activation of the semiconductor material in doping is promoted.

The ion accelerating region is put into a vacuum, and the diborane gas is introduced into this accelerating region from the plasma source 901. Then, a decelerating voltage of −1 kV is applied by the decelerating voltage source 904. An accelerating voltage of 27 kV is immediately applied by the accelerating voltage source 903, and its state is held for 5 seconds. A draw out voltage of 3 kV is applied analogously by the draw out voltage source 901 for one second. By the above process, a B ion is introduced from the surface of the silicon oxide film toward the silicon film in the profile of FIG. 10.

Figure 10:
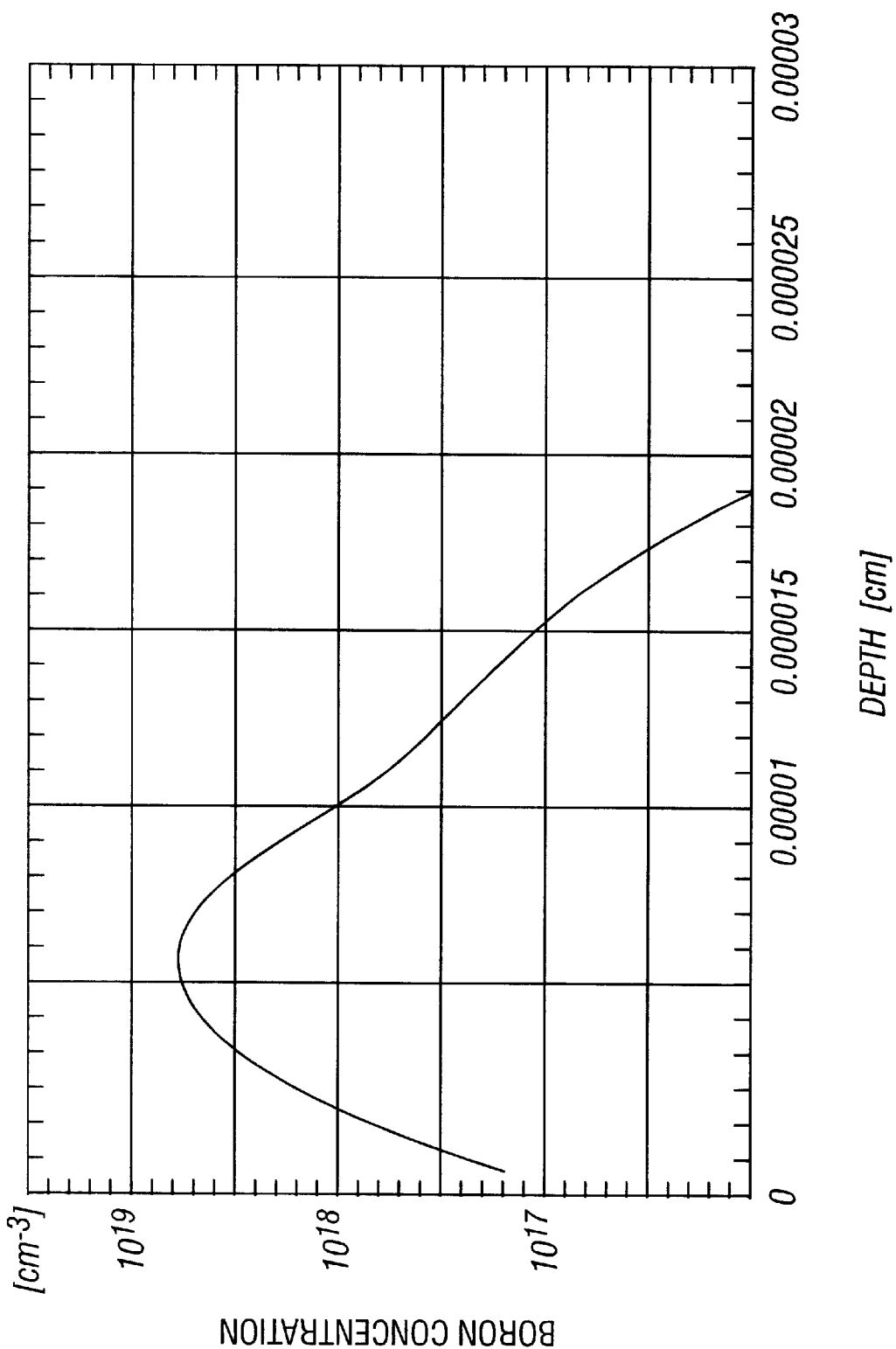
FIG. 10 shows the distribution of concentration of boron ions in the fifth embodiment.

In FIG. 10, the abscissa represents a thickness of the silicon oxide film from its surface whereas the ordinate represents the concentration of B ion. In a profile of the depth of 1200 Å to 1700 Å, it is found that dopant is introduced at a concentration of 1 to $3\times10^3$ cm$^{-3}$. This is a profile caused by a light ion seek BH$_x$ (For example, BH$_2^+$) that mainly contains one boron atom.

In a profile of from the surface to the depth of 1200 Å, it is a large mountain-shaped profile, and B ion of $2\times10^{19}$ cm$^{-3}$ is implanted at the maximum. The mountain-shaped profile is caused by a heavy ion seek B$_2$H$_y$ (for example, B$_2$H$_5^+$) that mainly contains two boron atoms. Since this region is in the silicon oxide film, the characteristic of the TFT is not adversely affected at all by the introduction of dopant regardless of the amount of introduced dopant. The reason why the silicon oxide film is formed is that boron is intended to be implanted into the silicon film at a low concentration of about $1\times10^{17}$ cm$^{-3}$. It is hard to directly implant an impurity ion into the silicon film at a concentration of about $1\times10^{17}$ cm$^{-3}$ by using an existing doping unit. The concentration mentioned here is a value for reference, and the impurity ion may be implanted at a desired concentration depending on a purpose. According to the experience of the present inventors, the TFT having a desired characteristic is obtained under the condition where the channel dope is implanted at a lower concentration than that implanted in the source/drain, and its value is $5\times10^{16}$ to $1\times10^{18}$ cm$^{-3}$.

After the doping, the silicon oxide film is removed to expose the crystalline silicon film, thereby forming the TFT.

Nickel is used for a metal element (catalytic element) that promotes crystallization of silicon. This is because the nickel element can obtain the more remarkable effect and the high reproducibility. As an element except for nickel, at least one element selected from Fe, Co, Ni, Ru, Rh, Pd, Os, Ir, Pt, Cu and Au can be used.

(Sixth Embodiment)

In this embodiment, a laser annealing process is performed subsequent to the doping process of the first embodiment. A purpose of irradiating a laser light is to further reduce the defective lattices in the silicon film, to improve the crystalline property, and to obtain the uniform distribution of dopant on the substrate surface. Thus, after the silicon oxide film is removed by etching subsequent to the doping process, laser annealing is conducted.

Figure 11:
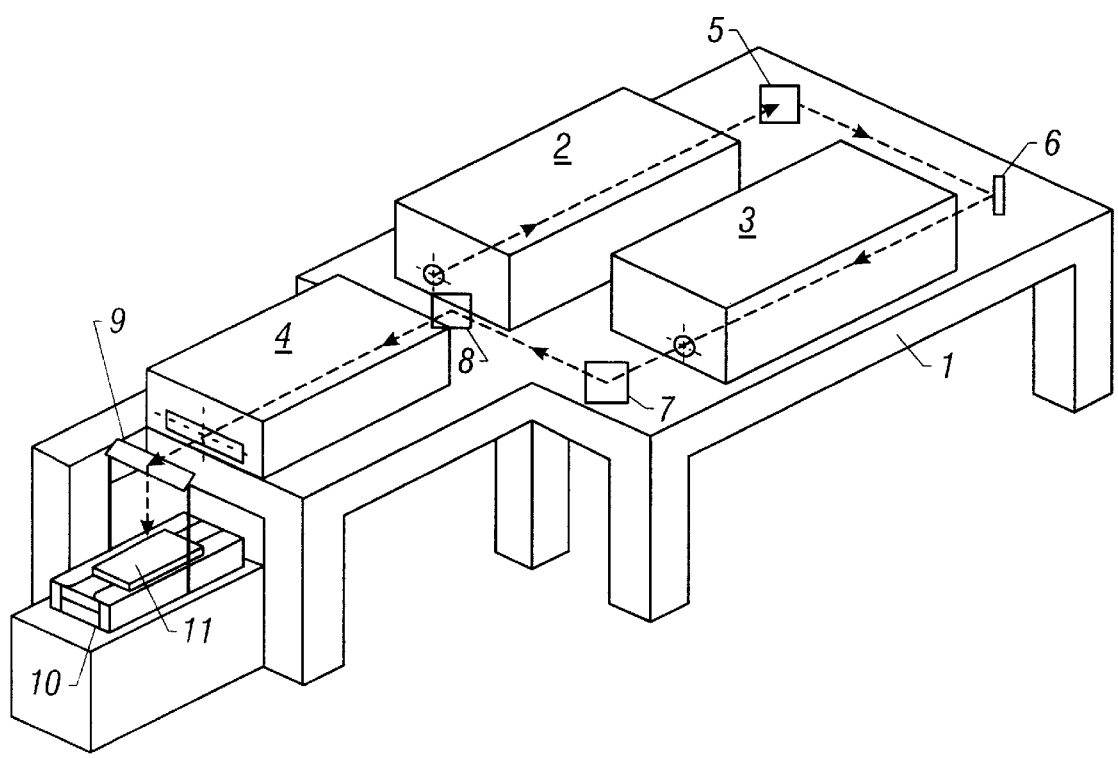
FIG. 11 is a structural diagram of a unit for irradiating a laser light in the sixth embodiment.

A unit for irradiating a laser light will be described. FIG. 11 is a schematic diagram of a laser annealing unit used in this embodiment. A laser light is oscillated by an oscillator 2. The oscillated laser light is of the KrF excimer laser (wavelength of 248 nm, pulse width of 25 ns). Other excimer laser or a laser of another type can be used.

The laser light oscillated by the oscillator 2 is amplified by an amplifier 3 via total reflection mirrors 5 and 6, and introduced into an optical system 4 via total reflection mirrors 7 and 8. The laser light beam immediately before being incident to the optical system 4 is rectangular of about 3×2 cm$^2$, but the laser light beam is processed into a slender beam (linear beam) having a length of about 10 to 30 cm and a width of about 0.1 to 1 cm. The energy of the laser light that has passed the optical system 4 is 1000 mJ/shot at the maximum.

The reason why the laser light is processed into the slender beam is to improve the processability. That is, after being out of the optical system 4, the linear beam is irradiated onto a sample 11 via the total reflection mirror 9. Since the width of the beam is longer than that of the sample. the laser light can be irradiated on the entire sample with the movement of the sample in one direction. Thus, a sample stage 10 and a drive unit are simple in construction and easy in maintenance. The operation of positioning (alignment) the sample for setting is easy.

The sample stage 10 onto which a laser light is irradiated is controlled by a computer and so designed as to be moved at a right angle with respect to a linear laser light. A heater is equipped under the stage 10 for holding the sample to a desired temperature in laser light irradiation.

Figure 12C:
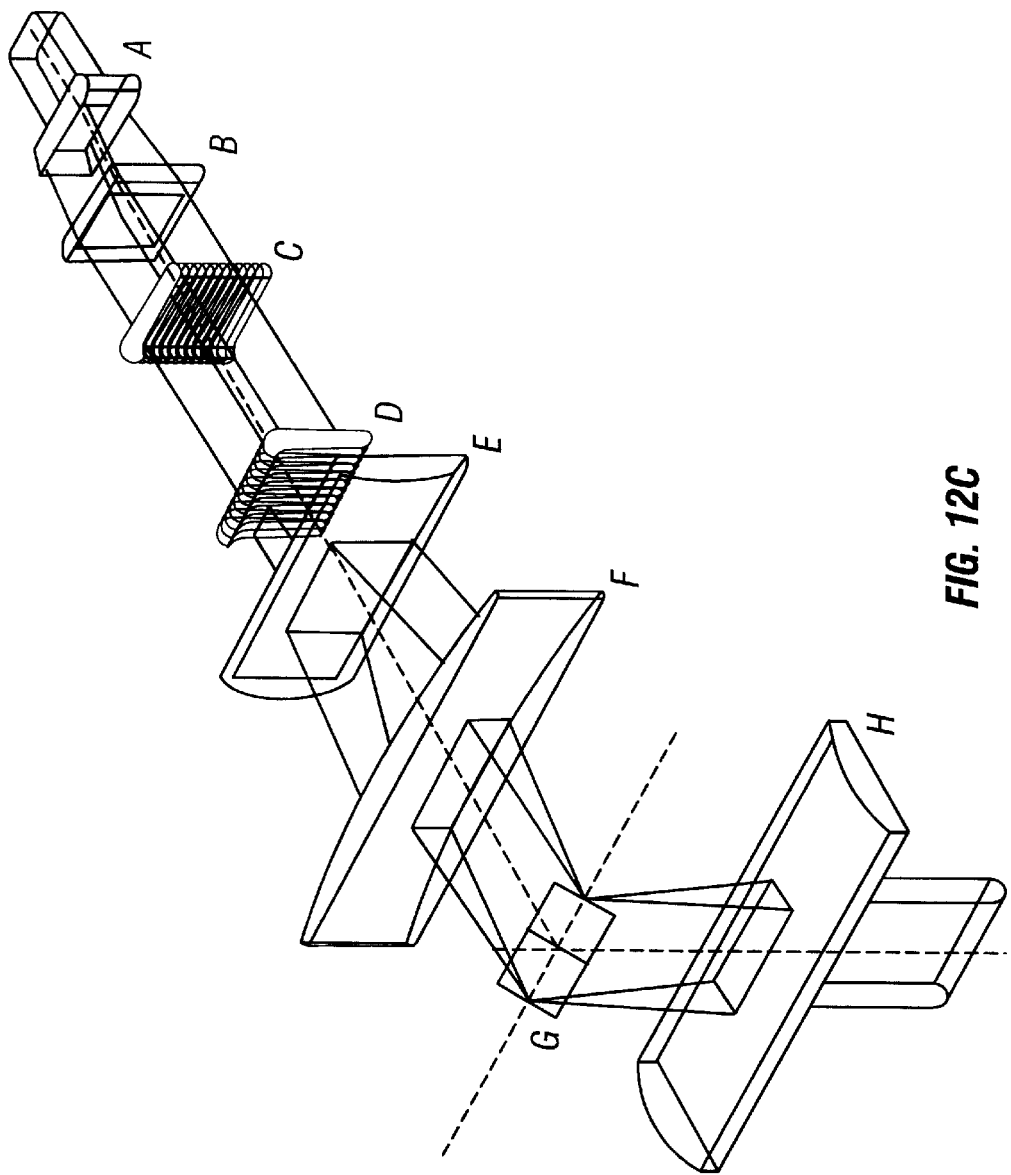

An optical path in the optical system 4 is shown in FIGS. 12A to 12C. A laser light incident to the optical system 4 passes through a cylindrical concave lens A, a cylindrical convex lens B, and lateral fly eye lenses C and D, whereby the laser light is changed from the Gaussian distribution type to the rectangular distribution. The laser light passes through cylindrical convex lenses E and F and then is focussed by a cylindrical lens H via a mirror G (corresponding to a mirror 9 in FIG. 11) to irradiate it onto the sample.

A specified laser irradiation is conducted as stated below. A laser beam is shaped into a rectangle with a beam shape conversion lens, and a beam area at an irradiated portion is 125×1 mm. The sample is mounted on the stage 10, and the laser beam is irradiated on the entire surface of the sample with the movement of the stage 10 at 2 mm/sec.

The condition for irradiating a laser light is that a two-stage irradiation method includes a preliminary irradiation of 150 to 250 mJ/cm$^2$ and a main irradiation of 200 to 380 mJ/cm$^2$, and the number of pulses is 30 pulses/sec. the two-stage irradiation is made for suppressing the deterioration of the uniformity of the film surface caused by the laser irradiation as much as possible to form a film having a more excellent crystalline property.

In the irradiation of a laser light, the substrate temperature is 200° C. This is conducted to make gentle the rising rate and the falling rate of the temperature of the substrate surface caused by the laser. In this embodiment, the substrate temperature is 200° C. In the actual practice, a temperature optimum to the laser annealing is 100 to 600° C. The atmosphere control is not particularly conducted, and the irradiation is conducted in the air.

(Seventh Embodiment)

This embodiment is shown in FIGS. 1A to 1F. A base layer 102 of silicon oxide having a thickness of 2000 Å is formed on a substrate (Corning 7059) 101 by sputtering. Then, an amorphous silicon film 103 containing a concentration of phosphorus and boron of 1×10$^{16}$ atoms/cm$^3$ or less is formed at a thickness of 200 to 1500 Å, e.g., 500 Å, by plasma CVD.

The surface of the amorphous silicon film is oxidized. A nickel acetate aqueous solution of 1 to 100 ppm is applied onto the amorphous silicon film and then dried, to form a nickel acetate layer (not shown). A surface active agent may be added to the solution as in the first embodiment.

The amorphous silicon film is crystallized by thermally annealing at 550° C. for 4 hours in the nitrogen atmosphere. The optical annealing may be conducted using an excimer laser, etc., after the annealing. After the thermal annealing, a silicon oxide film 104 having a thickness of 800 to 2000 Å, e.g., 1500 Å is deposited as a protective film by plasma CVD.

Boron is doped by ion doping. The doping gas is diborane (B$_2$H$_6$) of 5% diluted with hydrogen. An accelerating voltage is 30 kV. The dose is 6×10$^{12}$ to 2×10$^{14}$ atoms/cm$^2$, e.g., 3×10$^{13}$ atoms/cm$^2$ (FIG. 1A)

After the doping, the protective silicon oxide film is removed, and then the KrF excimer laser is irradiated to activate the doped impurity. The energy density of a laser is 250 to 400 mJ/cm$^2$, e.g., 370 mJ/cm$^2$. A laser light of 2 to 20 shots is irradiated for each portion of the silicon film. The substrate temperature is 200° C. (FIG. 1B)

The silicon film is etched to form an island-like silicon region 105. A silicon oxide film 106 having a thickness of 1200 Å is deposited as a gate insulating film by plasma CVD. The raw gas in the plasma CVD is TEOS and oxygen. The substrate temperature in film formation is 250 to 380° C., e.g., 300° C. (FIG. 1C).

An aluminum film (containing silicon of 0.1 to 2%) having a thickness of 3000 to 8000 Å, e.g., 6000 Å is deposited by sputtering, and then etched to form a gate electrode 107 (FIG. 1D).

An impurity (phosphorus) is implanted into a silicon region with the gate electrode 107 as a mask by ion doping. The doping gas is phosphine (PH$_3$) of 1 to 10% diluted with hydrogen. An accelerating voltage is 60 to 90 kV, e.g., 80 kV. The dose is 1×10$^{13}$ to 8×10$^{15}$ atoms/cm$^2$, e.g., 2×10$^{14}$ atoms/cm$^2$. The substrate temperature in the ion doping is a room temperature. As a result, n-type impurity regions 108 (source) and 109 (drain) are formed (FIG. 1D).

To activate the doped phosphorus, optical annealing is conducted using the KrF excimer laser. The energy density of the laser is 150 to 350 mJ/cm$^2$, e.g., 250 mJ/cm$^2$. A laser light of 2 to 20 shots is irradiated for each portion of the silicon film. The substrate temperature is 200° C. (FIG. 1E)

A silicon oxide film 110 having a thickness of 6000 Å is formed as an interlayer insulator by plasma CVD to form contact holes therein, and electrodes-wirings 111 and 112 for the source and the drain of the TFT are formed by a metal material, e.g., a multilayer film made of titanium and aluminum (FIG. 1F).

Thermal annealing at 200 to 350° C. is conducted in the hydrogen atmosphere of one normal atmosphere. The heat treatment in which a temperature exceeds 300° C. after boron doping (FIG. 2B) to control the threshold value voltage includes formation of the gate insulating film, formation of the interlayer insulating film and hydrogen annealing. However, in any case, a temperature does not exceed 450° C.

Figure 6:
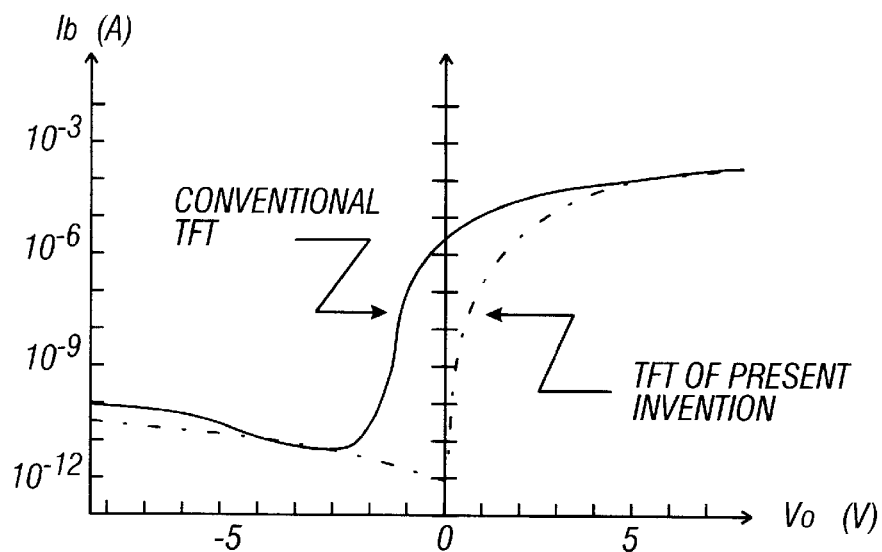
FIG. 6 shows the characteristic, etc., of a TFT obtained in the seventh embodiment.

An example of the characteristic of the obtained TFT is shown in FIG. 6. The $I_D$–$V_G$ characteristic of the TFT produced through the same process as that in this embodiment except that the doping process and the subsequent optical annealing process of FIGS. 1A and 1B are not conducted is indicated by a solid line in FIG. 6. It is clearly found that the threshold value is shifted toward the negative direction (left side). The rising of a drain current (sub-threshold characteristic) is also gentle (=a S value is large).

The $I_D$–$V_G$ characteristic of the TFT in this embodiment is denoted by an alternate long and short dash line in FIG. 6, The threshold value is in the vicinity of 0 V, and a drain current rapidly rises (=the S value is small), which exhibits a desired characteristic of TFT.

(Eighth Embodiment)

This embodiment is shown in FIG. 2. A base layer 202 of silicon oxide having a thickness of 4000 Å is formed on a substrate (Corning 7059) 201 by plasma CVD. Then an amorphous silicon film 203 having a thickness of 200 to 1500 Å, e.g., 500 Å, is formed by plasma CVD. The surface of the amorphous silicon film is oxidized. An nickel acetate aqueous solution of 1 to 100 ppm is applied onto the amorphous silicon film and then dried, to form a nickel acetate layer (not shown).

A KrF excimer laser light is irradiated onto the silicon film and crystallized using the technique disclosed in Japanese Patent Unexamined Publication No. 6-318701. Thermal annealing may be preliminarily conducted at 250 to 500° C. before the laser irradiation. The substrate may be heated at 250 to 400° C. in the laser irradiation. It is effective to the removal of the distortion of crystal that thermal annealing is conducted at 400 to 550° C. for 1 to 4 hours after the laser irradiation (FIG. 2A).

Boron is implanted into the crystallized silicon film 203 by ion doping. The doping gas is diborane ($B_2H_6$) of 1% diluted with helium. An accelerating voltage is 5 to 20 kV, e.g., 10 kV. The dose is $1\times10^{11}$ to $1\times10^{13}$ atoms/cm$^2$, e.g., $1\times10^{12}$ atoms/cm$^2$. In the ion doping, the substrate is heated to 350° C. by a heater 204. Thus, a small amount of boron is implanted in the silicon film. Also, since doping is conducted while heating the substrate, the activation is unnecessary in the following processes (FIG. 2B).

The crystallized silicon film 203 is etched to form an island-like silicon region. A silicon oxide film 205 having a thickness of 1200 Å is deposited by plasma CVD. Hydrogen annealing is conducted at 200 to 350° C., e.g., 320° C. for one hour, so that dangling bonds existing on the interface between the silicon oxide film 205 and the silicon film is neutralized by hydrogen. Chlorine compound such as hydrogen chloride or fluorine compound such as hydrogen fluoride) of 1 to 50 volume % may be added to hydrogen.

A gate electrode 206 of a titanium film having a thickness of 4000 Å is formed on the silicon oxide film 205.

An impurity (phosphorus) is implanted into silicon region with the gate electrode 206 as a mask by ion doping. The doping gas is phosphine ($PH_3$) of 5% diluted with hydrogen. An accelerating voltage is 60 to 90 kV, e.g., 80 kv. The dose is $1\times10^{12}$ to $1\times10^{14}$ atoms/cm$^2$, e.g., $1\times10^{13}$ atoms/cm$^2$. In the ion doping, the substrate is heated at 350° C. by a heater 209. Thus, n-type low concentration impurity regions 207 and 208 are formed. Similarly in this case, since doping is conducted while heating the substrate, the activation is unnecessary in the following processes (FIG. 2C).

A silicon oxide film deposited by plasma CVD is anisotropically etched, to form side walls 210. The side walls 210 may be formed using a known LDD (low concentration drain) forming method. The silicon oxide film 205 is also etched at side wall formation. Thus, a gate insulating film 211 of silicon oxide remains under the gate electrode 206 and the side walls 210 (FIG. 2D).

Phosphorus is introduced again by ion doping. The doping gas is phosphine of 5% diluted with hydrogen. An accelerating voltage is 10 to 30 kV, e.g., 20 kV. The dose is $1\times10^{14}$ to $8\times10^{16}$ atoms/cm$^2$, e.g., $1\times10^{15}$ atoms/cm$^2$. In the ion doping, the substrate is heated at 350° C. by a heater 214. Thus, n-type high concentration impurity regions 212 (source) and 213 (drain) are formed.

A low concentration source 215 and a low concentration drain 216 are formed without being doped in the low concentration impurity regions 207 and 208 under the side walls 210 (FIG. 2E).

A silicon oxide film 217 having a thickness of 4000 Å is deposited as an interlayer insulator by plasma CVD, to form contact holes therein. thereby forming source and drain electrodes-wirings 218 and 219 made of aluminum (FIG. 2F).

In the processes subsequent to the doping process, since the activation by thermal annealing is not conducted, this embodiment is remarkably effective in the reduction of processes. In the conventional method (Japanese Patent Unexamined Publication No. 6-267989), a region containing a high concentration impurity can be activated by thermally annealing at a relatively low temperature, whereas the thermal annealing temperature needed to rise in a low concentration impurity region. However, in this embodiment, since it is unnecessary to conduct thermal annealing for activation, such a problem does not occur at all.

In FIG. 2B, boron is doped in a state where the crystallized silicon film 203 is exposed. However, as in the first and fifth embodiments, a silicon oxide film having a thickness of about 100 to 1500 Å is formed on the surface of the crystallized silicon film 203 and then boron is doped, so that the threshold value of the crystallized silicon film 203 may be corrected. The silicon oxide film is removed after the doping, and the n-channel TFT may be produced in accordance with the processes of FIG. 2C and the subsequent figures.

(Ninth Embodiment)

This embodiment is shown in FIG. 3. A base layer 302 of silicon oxide having a thickness of 3000 Å is deposited on a substrate (Corning 1737) 301 by plasma CVD. An intrinsic (I-type) amorphous silicon film 303 having a thickness of 200 to 1500 Å, e.g., 500 Å, is deposited by plasma CVD. A silicon oxide film 306 having a thickness of 1500 Å is deposited by plasma CVD. Those films are continuously formed.

Figure 3A:
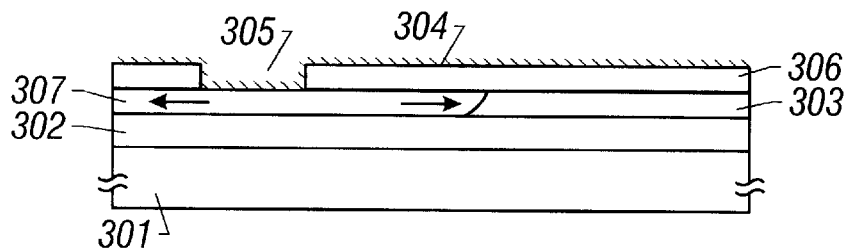
FIGS. 3A to 3G are cross-sectional views of a producing process in accordance with a ninth embodiment.

The silicon oxide film 306 is selectively etched to form a hole portion 305 in a part thereof, and a nickel acetate layer 304 is formed as in other embodiments. The substrate is thermally annealed at 450 to 580° C., e.g., 550° C. for 8 hours, to crystallize the amorphous silicon film 203. As disclosed in Japanese Patent Unexamined Publication No. 6-244104, crystallization progresses from the hole portion 305 toward the circumference along an arrow of the figure. The crystallized region is indicated by numeral 307 (FIG. 3A).

Figure 3B:
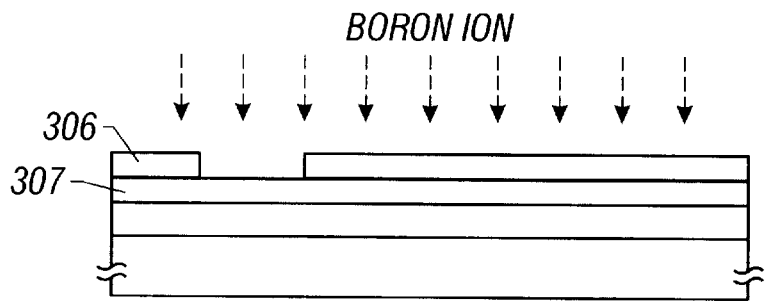

After the thermal annealing, boron is doped by ion doping. The doping gas is diborane ($B_2H_6$) of 5% diluted with hydrogen. An accelerating voltage is 30 kV. The dose is $6\times10^{12}$ to $2\times10^{14}$ atoms/cm$^2$, e.g., $3\times10^{13}$ atoms/cm$^2$. Thus, boron having a relatively high concentration (about $1\times10^{19}$ atoms/cm$^3$) is introduced into the hole portion 305. Also, the channel of a TFT channel may not be formed in this region. Since source and drain regions are doped with the phosphine having a concentration that exceeds sufficiently that of boron by the subsequent doping, there cause a practical problem. Boron having a concentration of about $1\times10^{17}$ atoms/cm$^3$ is introduced into the other regions, because boron concentration therein is lowered by the silicon oxide film 306 as in the embodiment 5 (FIG. 3B).

Figure 3C:
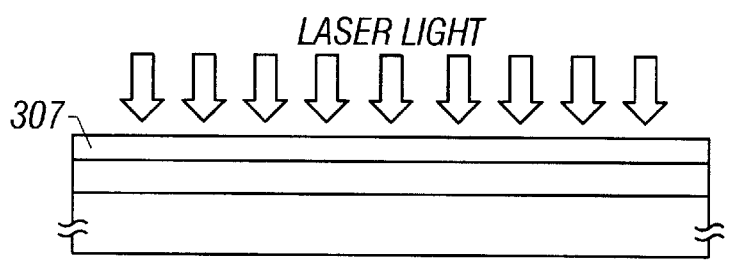

After the doping, the silicon oxide film 306 is removed, and the KrF excimer laser is irradiated to activate the doped impurity. The energy density of the laser is 250 to 400 mJ/cm$^2$, e.g., 370 mJ/cm$^2$. A laser light of 2 to 20 shots is irradiated for each portion of the silicon film. The substrate temperature is 200° C. by this laser irradiation, the activation of impurity and the crystalline property of the silicon film can be improved simultaneously (FIG. 3C).

Figure 3D:
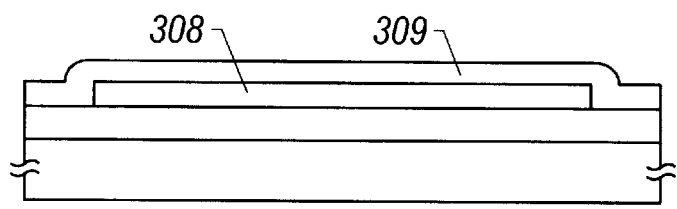

The silicon film is etched to form an island silicon region 308, and then a silicon oxide film 309 having a thickness of 1200 Å is deposited by plasma CVD (FIG. 3D).

Figure 3E:
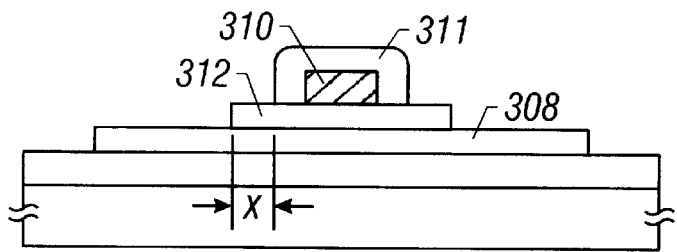

A gate electrode 310 made of an aluminum film (containing 0.1 to 0.3% scandium) having a thickness of 6000 Å is formed on the silicon oxide film 309. The side and upper surfaces of the gate electrode 310 are coated with a barrier type anodic oxide 311 by anodization of the gate electrode 310 as disclosed in Japanese Patent Unexamined Publication No. 5-267667. The thickness of the anodic oxide 311 is 1500 to 2000 Å. The silicon oxide film 309 is etched to form a gate insulating film 312, thereby obtaining a structure in which the end surface of the gate electrode 310 (including the anodic oxide 311) is shifted by "x" from the end surface of the gate insulating film 312 (FIG. 3E).

An impurity (phosphorus) is implanted in the silicon region using the gate electrode 310 and the gate insulating film 312 as masks by ion doping. The doping gas is phosphine (PH$_3$) of 5% diluted with hydrogen. The doping is divided into two stages. In the first stage, an accelerating voltage is 60 to 90 kV, e.g., 80 kV, and the dose is 1×10$^{12}$ to 1×10$^{14}$ atoms/cm$^2$, e.g., 1×10$^{13}$ atoms/cm$^2$. In the second stage, the accelerating voltage is 10 to 30 kV, e.g., 20 kV, and the dose is 1×10$^{14}$ to 8×10$^{15}$ atoms/cm$^2$, e.g., 1×10$^{15}$ atoms/cm$^2$.

Figure 3F:
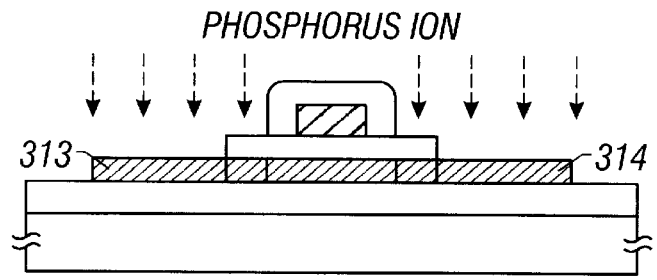
Figure 5:
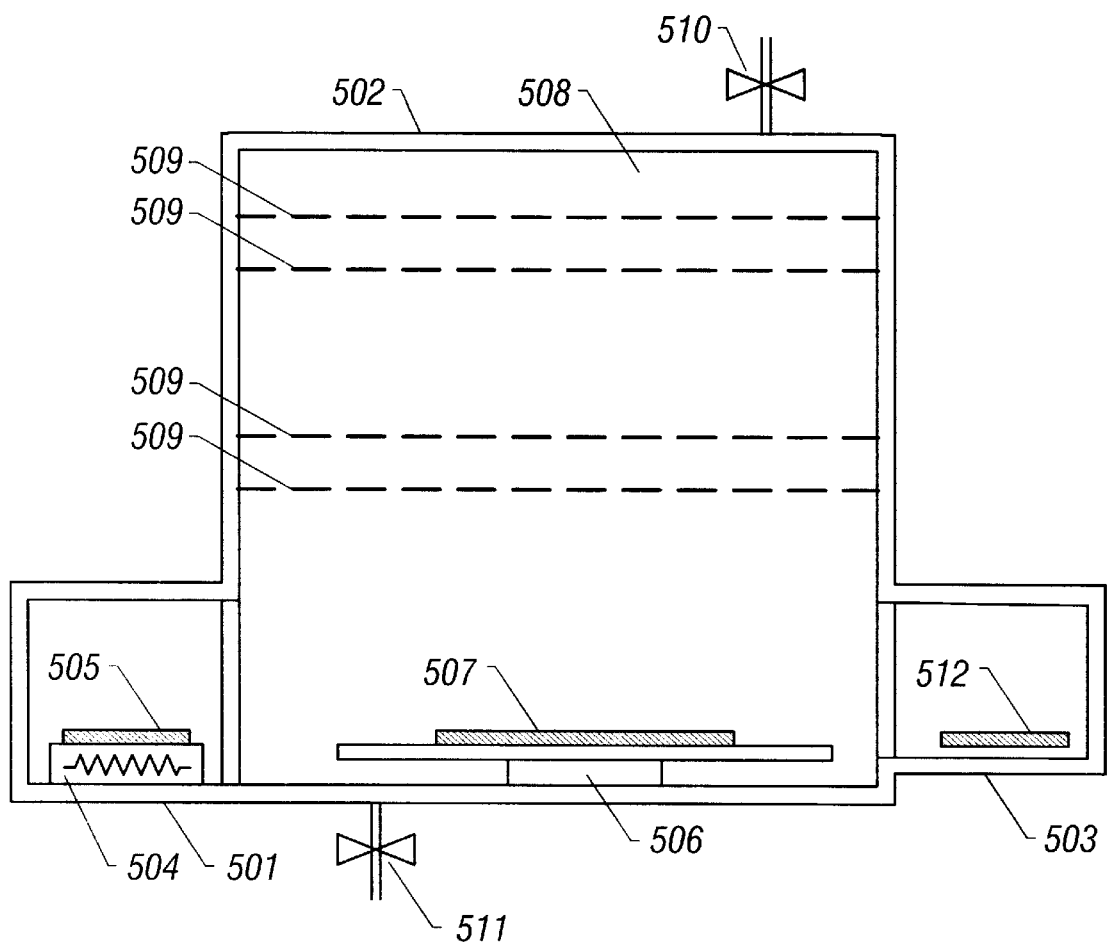
FIG. 5 shows a doping unit used in the present invention.

In any case, doping is conducted for the substrate heated at 300° C. in a preliminary chamber by the unit of FIG. 5. Thus, annealing is particularly unnecessary for activation after the doping. As a result of low concentration doping (the first doping) at a high accelerating voltage, a low concentration source 316 and a low concentration drain 317 are formed. Also, as a result of high concentration doping (the second doping) at a low accelerating voltage, a source 313 and a drain 314 are formed respectively (FIG. 3F).

Figure 3G:
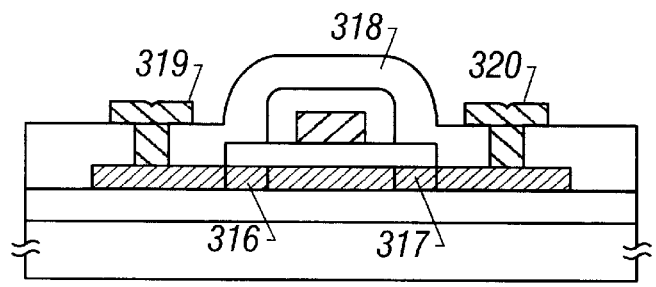

A silicon oxide film 318 having a thickness of 5000 Å is deposited as an interlayer insulator by plasma CVD, to form contact holes therein. so that source and drain electrodes-wirings 319 and 320 made of titanium are formed (FIG. 3G).

In the sixth embodiment, to obtain the like LDD structure, it is required that a film forming process or the like is conducted after the low concentration doping, and then the high concentration doping is again conducted. In this embodiment, the low concentration doping and high concentration doping are continuously conducted, thereby extremely improving the mass productivity, which is different from the eighth embodiment.

(Tenth Embodiment)

This embodiment is shown in FIG. 4. A base layer 402 of silicon oxide having a thickness of 2000 Å is formed on a substrate (Corning 7059) 401 by sputtering. An amorphous silicon film 403 having a thickness of 200 to 1500 Å, e.g., 500 Å, is continuously formed by plasma CVD. A nickel acetate aqueous solution is applied on the surface of the amorphous silicon film 403 and then dried by the same method as that in the first embodiment, to form a nickel acetate layer 404 (FIG. 4A).

Figure 4A:
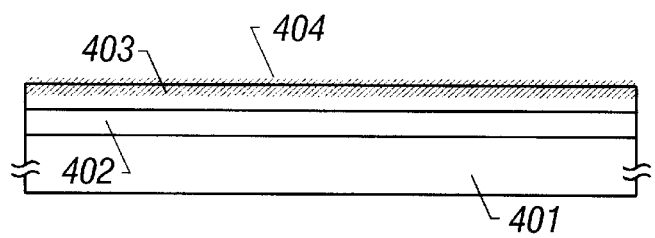
FIGS. 4A to 4F are cross-sectional views of a producing process in accordance with a tenth embodiment.
Figure 4B:
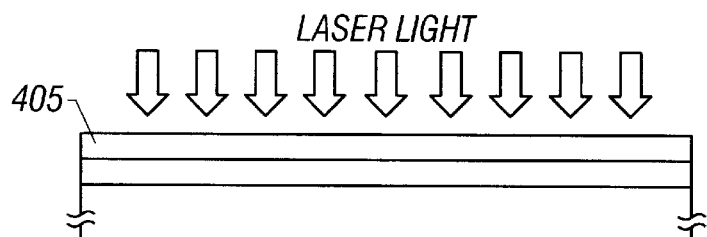

The amorphous silicon film 403 is thermally annealed at 550° C. for 4 hours in the nitrogen atmosphere to obtain a crystalline silicon film 405. After the thermal annealing, optical annealing is conducted using the KrF excimer laser, to further improve the crystalline property. The energy density of the laser is 150 to 350 mJ/cm$^2$, e.g., 250 mJ/cm$^2$. A laser light of 2 to 20 shots is irradiated for each portion of the silicon film. The substrate temperature is 200° C. (FIG. 4B)

Figure 4C:
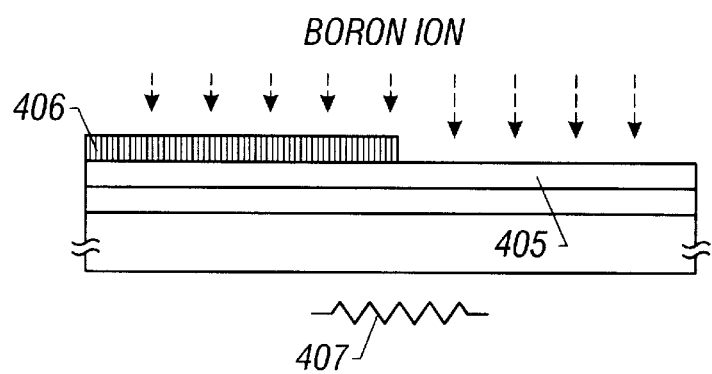

The crystalline silicon film 405 is doped with boron by ion doping in a state where a portion forming the p-channel type TFT is covered with a photoresist mask 406. The doping gas is diborane (B$_2$H$_6$) of 1% diluted with helium. An accelerating voltage is 5 kV. The dose is 6×10$^{11}$ to 2×10$^{13}$ atoms/cm$^2$, e.g., 3×10$^{12}$ atoms/cm$^2$. In ion doping, the substrate is heated to 250° C. by a heater 407. As a result, only a portion where the n-channel TFT is formed is doped with a small amount of boron. It is unnecessary to conduct annealing for activation after the doping (FIG. 4C)

The crystalline silicon film 405 is etched to form island-like silicon regions 408 and 409. A silicon oxide film 410 having a thickness of 1200 Å is deposited as a gate insulating film by plasma CVD. The raw gas in the plasma CVD is silane and oxygen. The substrate temperature in film formation is 350 to 450° C., e.g., 430° C.

Figure 4D:
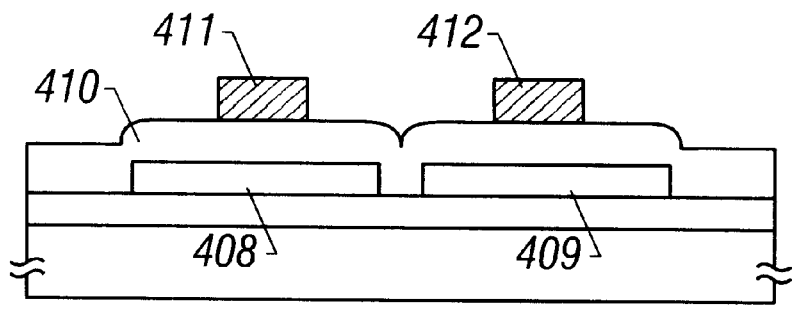

An aluminum film (containing 0.1 to 2% scandium) having a thickness of 3000 to 8000 Å, e.g., 5000 Å is deposited by sputtering, and then etched to form gate electrodes 411 and 412 (FIG. 4D).

Figure 4E:
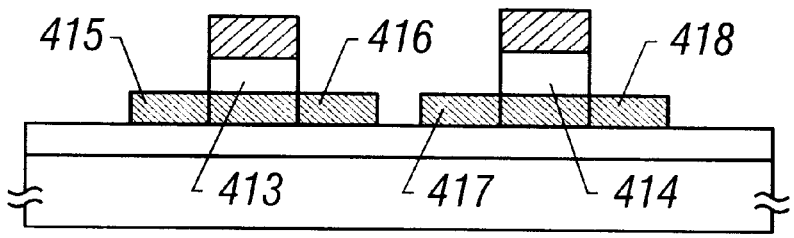

Using the gate electrodes 411 and 412 as masks, the silicon oxide film 410 is etched to expose the surface of silicon. Gate insulating films 413 and 414 remain under the gate electrodes 411 and 412. The p-type impurity (boron) is implanted into the silicon region 408, and the n-type impurity (phosphorus) is implanted into the silicon region 409, respectively. Doping may be made using a known CMOS producing technique. Thus, the p-type regions 415 and 416, and the n-type regions 417 and 418 are formed (FIG. 4E).

After doping, annealing is conducted at 430° C. for 4 hours to activate the doped impurity. Since nickel of about 1×10$^{18}$ atoms/cm$^3$ is contained in the silicon film, the activation can be conducted at a low temperature, as disclosed in Japanese Patent Unexamined Publication No. 6-267989. When the substrate temperature is 100 to 400° C. in the doping, the activation by the thermal annealing is particularly unnecessary. When an accelerating voltage in the doping is 30 kV or less, a damage on the silicon crystal can be reduced, so that the temperature of activation by thermal annealing can be lowered.

Figure 4F:
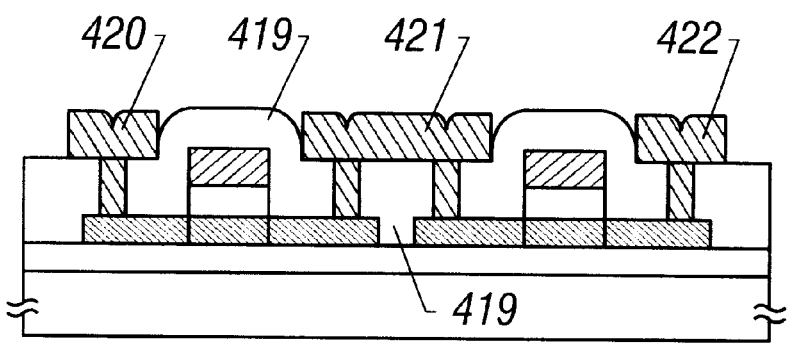

A silicon oxide film 419 having a thickness of 6000 Å is formed as an interlayer insulator by plasma CVD, to form contact holes therein, so that source and drain electrode-wirings 420, 421 and 422 of TFT are formed by an aluminum film (FIG. 4F).

In this embodiment, channel doping may be conducted after forming a silicon oxide film on the crystalline silicon film 405 in the doping process of FIG. 4C, as in the first embodiment. Not only the crystalline silicon film 405 forming the n-channel TFT but also the crystalline silicon film 405 forming the p-channel TFT may be doped with boron, so that the threshold value of the crystalline silicon film 405 is corrected. After the channel doping, a complementary TFT may be produced by the process of FIG. 4D and the following processes after the removal of the silicon oxide film.

According to the present invention, the threshold value of the semiconductor element (TFT etc.) using a non-single crystalline silicon film can be controlled, and the characteristic of the semiconductor integrated circuit constituted with the semiconductor element can be improved. In the fifth to seventh embodiments, although only the n-channel TFT is described, it is effective that the threshold value voltage is set to an appropriate value by doping the p-channel TFT with boron.

In the doping of the present invention, a repair process for the lattice defect caused by the doping becomes useless or is completed for a short time. Also, the doping can be conducted more homogeneously in comparison with the conventional method.

The above effect is effective particularly in the case where a plurality of elements having the same function are formed on the same substrate. This is because, when the doping is not conducted homogeneously, nonuniformity of the characteristic between the respective elements occurs. Such a nonuniformity is particularly harmful to a pixel formed in the liquid crystal display unit particularly using the TFT. Hence, the present invention is useful in the industrial viewpoint.

What is claimed is:

1. A doping method comprising introducing ions of a dopant impurity into a non-single crystalline crystallized semiconductor material having grain boundaries therein and formed over a substrate; and heating the substrate at 50 to 550° C. during the introduction of the ions, wherein the introducing includes channel doping for introducing boron into an intrinsic or substantially intrinsic semiconductor material crystallized by using a metal element.

2. The method of claim 1 wherein the semiconductor material comprises a silicon film.

3. The method of claim 1 wherein the dopant is introduced into an LDD region of a TFT.

4. A channel doping method for a semiconductor device, comprising:

forming a non-single crystalline and crystallized semiconductor film having grain boundaries therein on an insulting surface of a substrate;

forming a removable film on the silicon film semiconductor film; and introducing a dopant into the semiconductor film with said substrate maintained at 50 to 500° C. through the removable film.

5. The method of claim 4 wherein the removable film is a silicon oxide film having a thickness of 100 to 1500 Å.

6. The method of claim 4 wherein a concentration of the dopant in the silicon film is $1\times10^{15}$ to $3\times10^{18}$ cm$^{-3}$.

7. The method of claim 6 wherein the concentration of the dopant is a value measured by SIMS.

8. The method of claim 4 wherein the dopant is introduced into the silicon film at a concentration of ¼ times to 4 times as much as a spin concentration of the silicon film, measured by electronic spin resonance.

9. The method of claim 8 wherein the concentration of the dopant is a value measured by SIMS.

10. A doping method, comprising:

introducing a dopant into a non-single crystalline crystallized semiconductor film having grain boundaries therein and formed over a substrate with said substrate maintained at a temperature from 50 to 500° C.; and irradiating an intense light onto the semiconductor film after the introducing.

11. The method of claim 10 wherein the intense light is an excimer laser.

12. The method of claim 10 wherein the intense light is a linear excimer laser.

13. A channel doping method for a semiconductor device comprising:

forming a non-single crystalline crystallized semiconductor film having grain boundaries therein on an insulating surface of a substrate;

forming a removable film on the semiconductor film;

introducing a dopant into the semiconductor film at 50 to 500° C. through the removable film;

removing the removable film after the introducing; and irradiating an excimer laser or other intense energy onto the semiconductor film after the removing.

14. The method of claim 13 wherein the removable film is a silicon oxide film having a thickness of 100 to 1500 Å.

15. The method of claim 13 wherein a concentration of the dopant in the silicon film is $1\times10^{15}$ to $3\times10^{18}$ cm$^{-3}$.

16. The method of claim 15 wherein the concentration of the dopant is a value measured by SIMS.

17. The method of claim 15 wherein the dopant is introduced into the silicon film at a concentration of ¼ times to 4 times as much as a spin concentration of the silicon film, measured by electronic spin resonance.

18. The method of claim 17 wherein the concentration of the dopant is a value measured by SIMS.

19. The method of claim 13 wherein the excimer laser is a linear laser.

20. A method of manufacturing a semiconductor device, comprising:

forming an amorphous semiconductor film including silicon adjacent a substrate;

crystallizing the amorphous semiconductor film;

introducing ions of a dopant impurity into the crystallized semiconductor film wherein the crystallized semiconductor film includes grain boundaries therein;

patterning the crystallized semiconductor film into at least one active layer for forming a channel region of a thin film transistor after the introduction of the ions, wherein the substrate is maintained at a temperature between 50 to 500° C. during the introduction of the ions.

21. A method according to claim 20 wherein the amorphous semiconductor film is crystallized by utilizing a catalyst metal for promoting crystallization thereof.

22. A method according to claim 20 further comprising forming a silicon oxide film on the crystallized semiconductor film, through which the ions are introduced.

23. A method according to claim 20 wherein the dopant impurity is boron.

24. A method according to claim 20 wherein the dopant impurity is introduced at a concentration of not higher than $3\times10^{18}$ atoms/cm$^3$.

25. A method according to claim 20 further comprising a step of activating the dopant impurity in the semiconductor film at a temperature not higher than 450° C.

* * * * *